United States Patent
Chapel et al.

(10) Patent No.: US 12,426,200 B2
(45) Date of Patent: *Sep. 23, 2025

(54) MODULAR DATA CENTER COOLING

(71) Applicant: Zonit Structured Solutions, LLC, Boulder, CO (US)

(72) Inventors: Steve Chapel, Iliff, CO (US); William Pachoud, Boulder, CO (US)

(73) Assignee: Zonit Structured Solutions, LLC, Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/660,724

(22) Filed: May 10, 2024

(65) Prior Publication Data

US 2025/0016950 A1  Jan. 9, 2025

Related U.S. Application Data

(63) Continuation of application No. 17/195,000, filed on Mar. 8, 2021, now Pat. No. 11,985,790, which is a continuation of application No. 14/217,225, filed on Mar. 17, 2014, now Pat. No. 10,945,351.

(60) Provisional application No. 61/799,698, filed on Mar. 15, 2013.

(51) Int. Cl.
*H05K 7/20* (2006.01)
*G06F 1/20* (2006.01)
*H05K 7/02* (2006.01)

(52) U.S. Cl.
CPC ........... *H05K 7/20145* (2013.01); *G06F 1/20* (2013.01); *H05K 7/02* (2013.01); *H05K 7/023* (2013.01); *H05K 7/20736* (2013.01); *G06F 1/206* (2013.01); *Y10T 29/49826* (2015.01)

(58) Field of Classification Search
CPC .......... H05K 7/20145; H05K 7/20136; H05K 7/20154; H05K 7/20163; H05K 7/20172; H05K 7/20181; H05K 7/2019
See application file for complete search history.

(56) References Cited

U.S. PATENT DOCUMENTS

| | | | | |
|---|---|---|---|---|
| 6,616,524 B2* | 9/2003 | Storck, Jr. | .......... | H05K 7/20745 361/678 |
| 7,751,188 B1* | 7/2010 | French | ............... | H05K 7/20736 361/691 |
| 8,514,573 B2* | 8/2013 | Yuan | ................... | H05K 7/20745 361/695 |
| 8,547,694 B2* | 10/2013 | Tang | ................... | H05K 7/20727 361/679.48 |

(Continued)

*Primary Examiner* — Ko-Wei Lin
(74) *Attorney, Agent, or Firm* — Davis Graham & Stubbs LLP

(57) ABSTRACT

A modular arrangement is provided for housing electronic equipment and associated cooling structure in a data center environment. The modular units provide cooling air on an as—needed basis to individual pieces of equipment by way of individual plenums and associated valves. The units can be interconnected by vertical stacking, in side-to-side arrangements, and back-to-back arrangements. A number of units can be interconnected to form a cell. The cells can be interconnected to form larger units. In this manner, data centers can be configured in any desired arrangement without requiring complicated cooling design.

11 Claims, 25 Drawing Sheets

(56) References Cited

U.S. PATENT DOCUMENTS

| | | | | |
|---|---|---|---|---|
| 8,570,734 B2* | 10/2013 | Yang | G06F 1/22 | 361/679.5 |
| 8,717,763 B2* | 5/2014 | Lin | H05K 7/20563 | 361/679.51 |
| 8,867,204 B1* | 10/2014 | Gardner | H05K 7/1497 | 361/679.49 |
| 9,310,855 B2* | 4/2016 | Godrich | H05K 7/1497 | |
| 2007/0037507 A1* | 2/2007 | Liu | F24F 11/77 | 454/229 |
| 2009/0156114 A1* | 6/2009 | Ahladas | H05K 7/20745 | 454/184 |
| 2009/0237880 A1* | 9/2009 | Levesque | H05K 7/186 | 361/826 |
| 2011/0267767 A1* | 11/2011 | Sun | H05K 7/20736 | 361/679.46 |
| 2012/0028562 A1* | 2/2012 | Heim | F24F 13/0218 | 454/333 |
| 2012/0100793 A1* | 4/2012 | Chang | H05K 7/20745 | 454/184 |
| 2012/0149294 A1* | 6/2012 | Labrecque | A01K 1/0064 | 454/353 |
| 2012/0247750 A1* | 10/2012 | Kobayashi | H05K 7/20836 | 165/287 |
| 2013/0019614 A1* | 1/2013 | Campbell | H05K 7/20209 | 62/62 |
| 2013/0094136 A1* | 4/2013 | Gross | H05K 7/20709 | 361/679.31 |
| 2013/0109288 A1* | 5/2013 | Tang | H05K 7/20172 | 416/244 R |
| 2013/0127313 A1* | 5/2013 | Schrader | H05K 7/2019 | 312/236 |
| 2013/0267160 A1* | 10/2013 | Hung | H05K 7/20736 | 454/184 |
| 2013/0295834 A1* | 11/2013 | Faist | H05K 7/20736 | 454/184 |
| 2014/0016269 A1* | 1/2014 | Yoshida | H05K 7/20727 | 415/213.1 |
| 2015/0056908 A1* | 2/2015 | Chapel | H05K 7/02 | 29/428 |

* cited by examiner

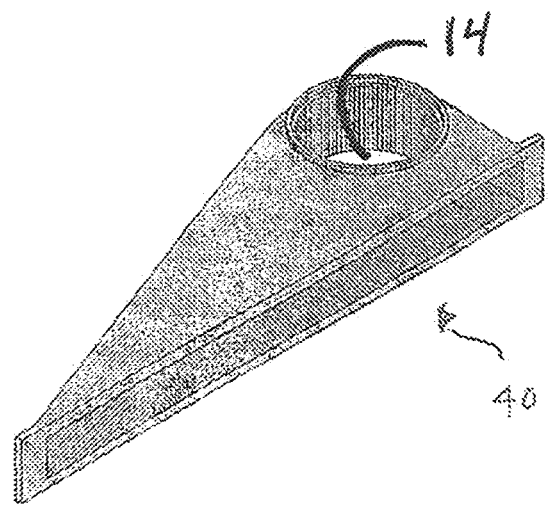
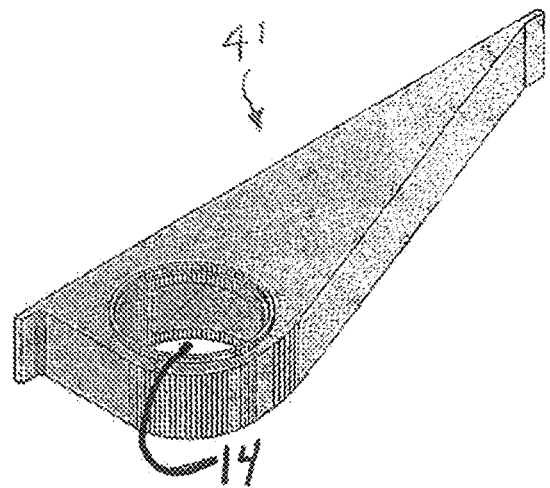
FIG. 4

MODULAR DATA CENTER COOLING

CROSS-REFERENCES

This application is a continuation of U.S. patent application Ser. No. 17/195,000, filed Mar. 8, 2021, which is a continuation of U.S. patent application Ser. No. 14/217,225, filed Mar. 17, 2014, now U.S. Pat. No. 10,945,351, issued Mar. 9, 2021, which is a non-provisional of U.S. Patent Application No. 61/799,698, entitled, "MODULAR DATA CENTER COOLING," filed Mar. 15, 2013, the contents of all of these applications and patents, which are herein incorporated by reference in their entireties and as set forth in full and priority from this application is claimed to the full extent allowed by U.S. law.

The following patent application publications are herein incorporated by reference in their entireties, though priority is not claimed: U.S. Patent Application Publication Nos. US2010/0149754-A1 and U.S. 2010/0142544-A1

FIELD

Embodiments of the present invention relate to the design and operation of data centers. The invention has application to the design and operation of data centers at higher power distribution per square foot levels than existing standards and methods can cost-effectively support.

BACKGROUND

Data center growth in the last decade has been explosive, both in square footage deployed, size of the largest facilities, and the increase in the average watts per square foot facilities are designed for. The last point has been the weak link in building larger and more efficient data centers. Cooling has always been the weak link in increasing data center deployment density and is the largest energy cost in the average facility, consuming approximately 60% of the electricity used by the data center.

Two problems have emerged as key points in the cooling of the electronic data processing (EDP) equipment in the data center:
1. Cooling high density deployments
    Server farms such as used by Internet-centric companies such as Google, Amazon, Ebay, and now cloud providers and other utility computing model based companies, are highly concentrated deployments of electronic data processing equipment that use a lot of power and give off a lot of heat. In other data centers, that are more general purpose, such as a university research center, compute clusters can be found, that also deploy large numbers of servers either as 1 or 2 U "pizza box" servers or as blade servers.
2. Cooling increasingly powerful central processing unit (CPU) chips
    Moore's Law regarding the doubling of CPU power has held up very well since Gordon Moore made the original prediction over 40 years ago. However, the primary issue facing ever more powerful CPU chips is becoming cooling, The amount of heat that modern multi-core CPU chips give off is becoming ever more difficult to manage, especially in the space limited packaging of standard 1 or 2 U "pizza-box" servers, which are still the most cost-effective models, due to their economies of very large scale mass production. Even in blade servers, the desire to pack in as many CPU units as possible leads to very limited space in the chassis for cooling to be accomplished.

The combination of these issues, how to keep more powerful CPU chips cool enough and how to get the heat produced by the relevant equipment out of the data center room are becoming more difficult and energy expensive problems to manage.

The relationship between the size of the server and the power requirement is a ratio described as the power density. As the power requirements go up for a given physical size of the server, the so-called "Power density" increases. At the same time the cooling requirements increase as well. Heat out equals power in, is the obvious relationship.

The standard approach has been to use raised floor as the cooling airflow plenum and then direct airflow out of that plenum as required. This approach worked in the lower power density environments of the past but has come up against significant problems. To raise cooling levels, additional air may be moved and used as the cooling medium. To do so air may be moved faster or the density may be increased in an effort to pressurize it. The other choice is to use other cooling methods to move heat more efficiently, (water or phase-changing liquids) by doing the cooling at the equipment rack and/or the equipment device itself.

Moving more air or pressurizing has real costs and is not efficient with the traditional methods. Most data centers have a lot more cooling tonnage than required from a heat in equals heat out perspective; that is, the data center is over-cooled since the cooling air is not efficiently used. Cooling air may not be effectively directed to the locations in which it may be productively used. Building HVAC systems have a whole set of ducts, valves, thermostats, etc. to efficiently do just this task, data centers built according to the traditional methodology do not (not enough space) and that in a nutshell captures the issues and limitations of the conventional cooling methods used in data centers.

The under-floor plenum may present issues regarding how high of a pressure may be effectively used and delivered. Also, the underfloor mixing that results in a large plenum means that there is cooling efficiency loss. These and the other factors mentioned have limited what can be achieved with traditional data center cooling methods. Hot/Cold aisles and other airflow management techniques have helped, but the end of the line for the current methods is in sight. Hot spots appear as power hungry EDP devices such as blade servers or compute clusters are deployed. The density of servers that can be deployed becomes a challenge in even custom designed "server farm" data center.

A lot of cooling alternatives have been tried and create issues. In a modern high-density data center, cooling issues have become nearly unmanageable without extreme measures. Often, exotic cooling systems with a morass of plumbing, high-pressure fluorocarbon containing pipes, or water in piping going directly to the cabinets and/or servers is employed. All of these solutions, although thermodynamically effective, are effectively un-manageable, very expensive and have other drawbacks, such as an inability to support high-change rates, large facility sizes (coolant that humans can't breathe limits the size of a room, just like halogen fire suppressant; people have to be able to get out of the room in time if there is an incident), high risk-reward ratios (e.g., such as replacing a water contaminated underfloor cabling plant) or other severe issues. In addition, traditional server deployments were accomplished with the use of legacy design equipment housings, called racks, or equipment racks, all of which are, in general practice, not efficient at utilizing the expensive square footage of a data center (DC). In addition to these issues described, the ability to distribute the increasing levels of power and greater numbers of data communications connections effectively has combined with the cooling problems to become a very difficult to deploy and manage conundrum, as the density and total number of servers is compressed into a given space. This problem has been addressed at many levels, and has a plethora of proposed solutions. This invention, and the associated methodology allows for an economical, effective and easy to manage overall solution to the current and near foreseeable data center infrastructure needs.

SUMMARY

The present invention relates to improving the capability of the data center environment to support greater computing densities per spare foot and per CPU chip. At the same time the modular, repeatable and easily adaptable methodology of the invention makes deploying and managing the four key elements of data center infrastructure at the "rack", (power distribution, network distribution, cooling distribution, the equipment mounting system itself—"the rack") much easier.

These objectives and others are addressed in accordance with the present invention by providing various systems, components and processes for improving data center infrastructure functions on the floor at the "rack". Many aspects of the invention, as discussed below, are applicable in a variety of contexts. However, the invention has particular advantages in connection with cooling, power distribution, efficiency and management in the data center. In this regard, the invention provides considerable flexibility in maximizing power density and cooling efficiency for use in data centers and other environments. The invention is advantageous in designing the server farms such as are used by companies such as Google or Amazon or cloud computing providers.

In accordance with one aspect of the present invention, a modular data center system and a process for configuring a data center are provided. The data center system includes a number of base modules each including an equipment support unit for mounting electronic equipment and a cooling unit, matched to said equipment support unit, for providing cooling air to the electronic equipment. For example, the equipment support unit may include a number of spaces for supporting individual pieces of electronic equipment and the cooling unit may include a number of plenums matched to the spaces of the equipment support unit. In addition, each of the plenums may be connected to a pressurized air passageway via a valve that is operative to control air flow as needed by an associated piece of electronic equipment. The pressurized air passageway can be interconnected to a modular air-based cooling assembly for delivering air to the base modules. Air may be driven through the cooling assembly from an air conditioning unit and may be pressurized by a compressor. In one implementation, the modular air-based cooling assembly is disposed under a raised floor of a data center and the base modules are positioned above the floor.

The base modules can be interconnected in any desired arrangement to configure a data center. In this regard, the base modules may be vertically stacked, interconnected in back-to-back arrangement, and interconnected in a side-to-side arrangement, or any combination thereof. A number of the base modules may be interconnected in three-dimensions to form a cell and cells may be then be interconnected to form larger units. The cooling units are designed so that the pressurized air passageways interconnect when the units are vertically stacked. The plenums are also preferably shaped so as to be complementary when the base modules are arranged back-to-back.

BRIEF DESCRIPTION OF THE DRAWINGS

The present disclosure is described in conjunction with the appended figures:

FIG. 4 shows a front and back orthogonal view of the regulator housing as applied to the example deployment of this invention;

Figure 1:
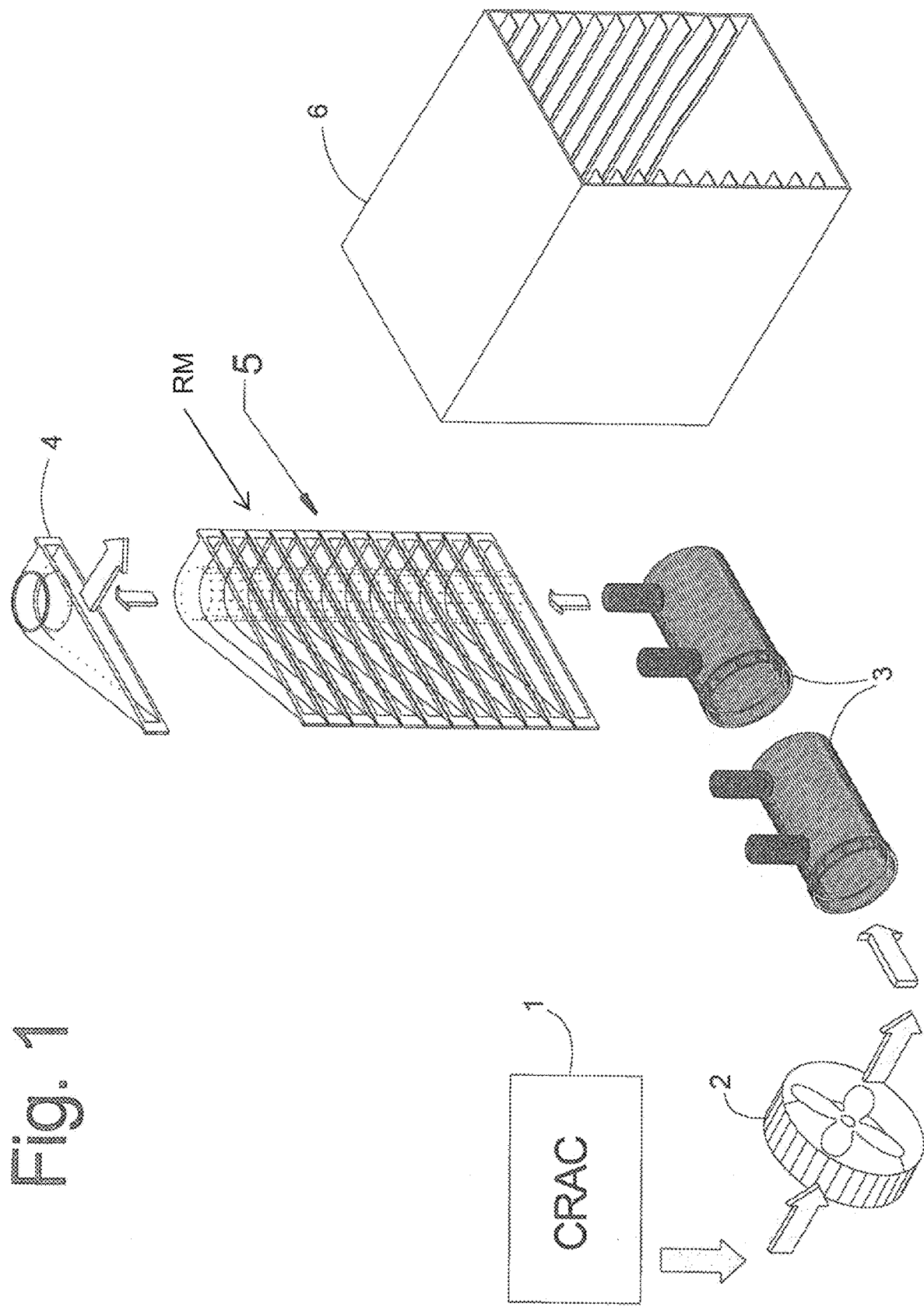
FIG. 1 shows the general components of an example of an embodiment of the invention.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

This section describes a method to modularly construct a thermodynamically efficient and space-minimized cooling system for data centers that efficiently incorporates the other needed elements of data center infrastructure, power distribution, network distribution and the equipment mounting apparatus "rack". For the purposes of this description, the system may be referred to as the Modular Deployment System (MDS).

Four principal components of the data center infrastructure are; equipment (servers, switches, storage, etc.) physical support and housing; power delivery and control/monitoring; heat removal; and data communications. Numerous other issues are also associated with a data center deployment, but these four define the physical space, and may dictate the form and function of the room and therefore a major part of the cost of acquisition, deployment, operation and ownership.

At the heart of the power in−power out equation is the ability to extract heat from the Electronic Data Processing equipment (especially servers, since servers typically use the most power; in the discussion that follows, servers are used as the example, but any high power usage EDP equipment may be used as an example) and remove the heat from the data center. The most common practice is to deliver the cooling in the form of chilled air, and let fans located inside of the servers circulate that air through each server to cool the internal components. As the "Power Density" increases, this becomes more and more difficult. Since this is the heart of the equation, this is a fundamental focus of the invention. Solving the effective delivery of coolant to the server is an important intent of the invention. Cooling is the most difficult problem to solve with high power densities. Upon solving this, the other problems can be effectively addressed, and optimized as an integrated infrastructure solution. Solving the cooling issues may allow an efficient design while improving, optimizing, and integrating one, some, and/or all of the other three principal infrastructure elements.

Because most present cooling methods rely on traditional Air Conditioning (A-C) technology, the use of the room air is limited to how cold and the volume per unit time of air can be delivered from the output of the A-C units, often called Computer Room Air Conditioners, or CRACs. The circulation methods, although very effective for many years, have reached their practical limit of being freely drawn in and circulated. Now, complex systems of air ducting are often deployed, using precious volumetric space in the data center, as well as forcing very limited options as regards equipment placement, at high expense. These ducting systems are highly customized, and generally complex.

A serious limitation of either ducting of traditional air delivery and return, or the use of pressurized gas (Fluorocarbon phase change gas) systems is the need for the space over the equipment racks to be utilized for equipment/ducting. This limits the use of that space for other infrastructure components such as power and network distribution. And, since the space under the floor (raised floor) must remain clear of components that obstruct air flow, the power delivery and communications is often elevated to the space above the racks as well, which conflicts with cooling ducting.

The ideal solution, is to deliver sufficient cooling, with a people-safe cooling medium (AIR) in a manner that is efficient at removing large quantities of heat, without using up all of the under-floor area, and being able to regulate the delivery of that air to each EDP device (for example a server), based on the needs of each server. Each server may use the amount of cooling to offset the power consumed. If a server is turned off, for example, little to no air for cooling may be used. Moving cooling air in the open room from unused or power limited locations to higher demand locations is inefficient.

FIG. 1 shows the principal elements of the general cooling components associated with this invention. All of the four principal components of the infrastructure can be addressed when deploying this methodology of cooling. Power delivery, and data communications can be moved back under the floor to recover the space above the racks for deployment of additional servers, or routed otherwise as is most advantageous. This is made possible by the deployment method enabled by this invention. The confinement of the cooling air to a smaller set of underfloor or overhead ducts (relative to using the underfloor as an air plenum in a raised floor example) or the open air in the room (in an on-grade example) frees up the design of the other infrastructure elements since the infrastructure elements have no aerodynamic function or impact on the cooling airflow pathways. In addition, the means of housing the equipment is described in a manner that is modular in design, allowing for the deployment of a wide variety of equipment configurations, with the maximum density of deployment. The invention can also be adapted for use in more traditional and conventional data center configurations, at some possible loss of optimization of all the combined infrastructure elements.

One example embodiment is described herein. Turning to FIG. 1, one of the principal components of the cooling system is a traditional high output CRAC unit (1). These are now available in 100, 150 Ton and higher capacities. A Ton of cooling is equivalent to 12,000 BTU (British Thermal Units), or about 3517 Watt-Hours. This means that for every 100 tons of cooling, about 352,000 Watts per hour of heat can be removed. The CRAC unit is shown, as it is the off-the-shelf available source of the cooling of the air in this example. Other means of supplying the cooling air may be utilized. Some examples would be outside air feeds (often filtered), outside air heat exchange, etc.) The output of the CRAC unit, exhausts under the raised floor of the data center. At this point, an air collection box from the output of the CRAC unit is coupled to one or more air compressors (2), typically conventional axial compressor fans, or turbofans. These fans take the relatively low pressure air from the output of the CRAC unit, delivering perhaps two inches H2O pressure, and increase the pressure of the air to 1.5 Bar A. This increase of air pressure to 1.5 times the ambient results in the ability of the air to be delivered via much smaller ductwork (3) to each server, and also allows the removal of all of the point of usage fans in each of the servers. The latter is an important gain, as the small fans used in a small 1 U enclosure are of limited efficiency.

The cooled air is "pressurized" right up to where the cooled air enters the servers (or any equipment requiring cooling) via the regulator (4). A single regulator (4) is shown turning the vertically disposed air column, and routing the cooled air into the flange that connects to an ESM and/or directs cooling air to a server or other EDP device. The ESM (or a conventional rack) can incorporate seals and/or other methods to ensure that the pressurized cooling airflow delivered to the ESM by the regulator(s) is efficiently routed through the EPD equipment. The flange may be connected to the server directly for better sealing and may incorporate flexible seals to accommodate a range of EDP equipment in standard sizes and configuration. Shown is a flange of about 17" wide by 1.5" high. This mates with industry standard back or front panel dimensions of a commonly selected size package, also known as a "1-U" format. The flange may be shaped differently to serve more than 1U with cooling air (thus requiring fewer regulators per rack), but 1U has been selected as an example to emphasize the point that the invention can control cooling down to the individual piece of equipment level. Other adaptors that allow a regulator to feed cooling air to a non-standard EDP equipment configuration (for example a side-to-side cooling pattern vs. the normal front-to-back pattern) are possible.

A multitude of these regulators stacked into an example group of 12 is shown (5). Other modulus combinations of regulator sizes are possible, such as a 1U+4U+1U+2U+2U+4U, but a set of 1U regulators is described for this example, as noted above. This regulator stack is referred to as a Regulator Module ("RM" (5)). Note the wedge shape of the RM (5). This is for improved air delivery pattern, and allows for being backed up by another set of RMs facing the opposite direction, utilizing as little space as possible. The air delivered by the regulators (4) in the RM (5) is delivered to an Equipment Support Module (ESM) (6). This ESM is similar in function to a traditional equipment rack, and may be replaced by a traditional rack. The ESM can hold traditionally sized EDP equipment, like a rack or can have equipment that is custom designed for use in an ESM. The essential difference between the ESM and a traditional rack is that the ESM is a module, part of a larger set of modules, that interlock together to form various height, width and depth groups of modules, called cells. This interlocked cell structure allows for minimal space usage by the racks, and maximizes the cubic space available for deployment of the servers, or any other electronic data processing (EDP) equipment. Maximizing the efficiency of the usage of the cubic volume of the data center room is a key point and a great benefit.

Figure 2:
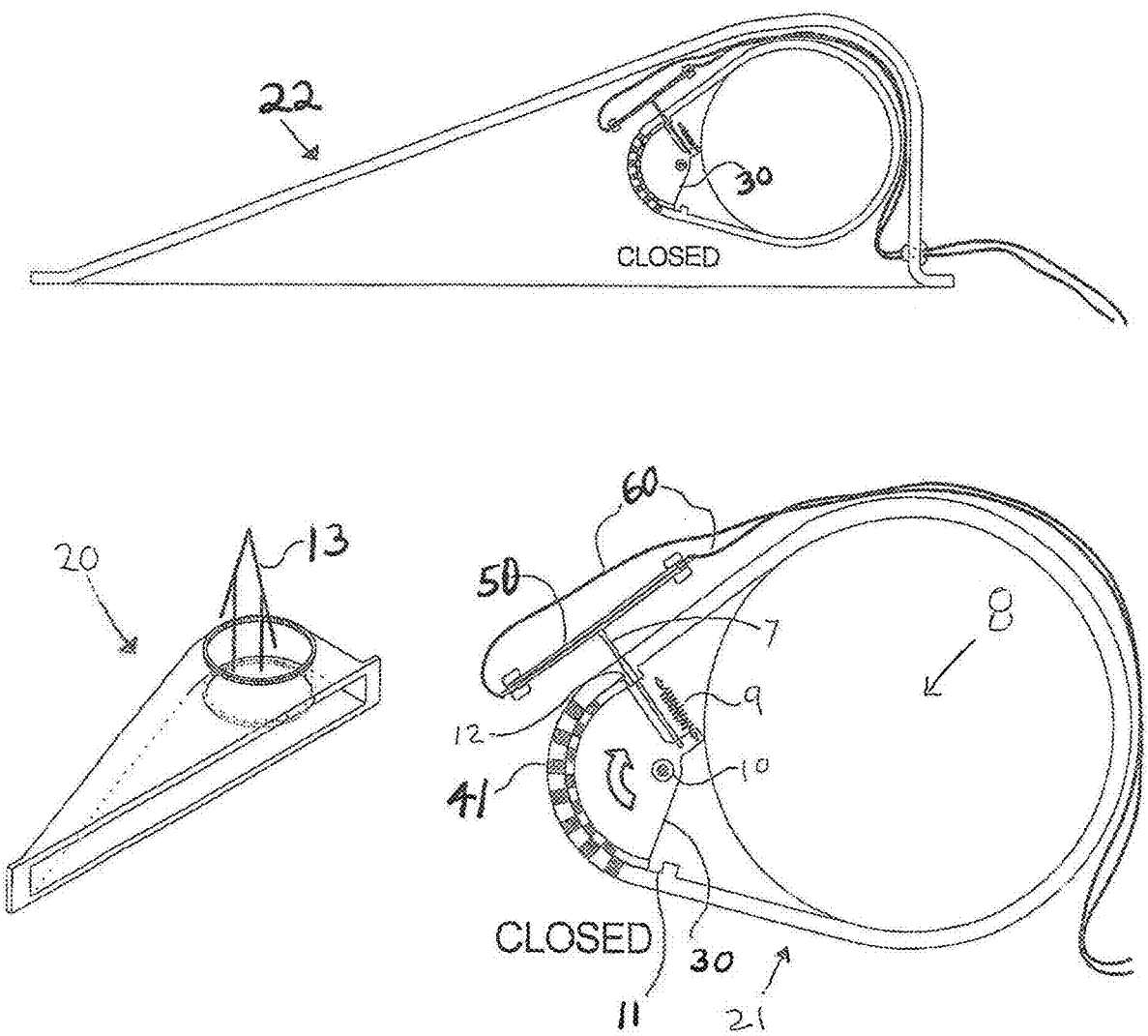
FIG. 2 shows a top view cross section through the horizontal axis of the Air Regulator with a detail view of the major components of the regulator and valve with the valve closed, as applied to the example deployment of this invention.

At the heart of the design is the ability to regulate the flow of air to each EDP device based on its heat output, which is directly proportional to its power usage. FIG. 2 is a top view of cross section through the regulator (22). An orthogonal phantom view of the regulator body (20) helps visualize the flow of air (13) through the regulator on its way to other regulators in the module(s). The example regulator (22) is shown with the air valve (30) in the closed position. Air (13) flows straight through the regulator body (20). A blow-up of the regulator mechanism is shown (21). Air is delivered to the regulator from the vertical duct opening (8), and in this example pressurized to about 7 psig. Pressure can be above or below this, but 7 psig is a nominal value. Each EDP device that receives cooling air might typically consume between 200 and 500 Watts of electrical power. The ability to deliver adequate cooling to this power level requires an average of 200 Watts cooling, or about 853 BTU of heat removal. The general air equation for heat transport capacity of air istwoBTU/100 cubic foot/degree. The average heat gain of the air volume is about 50 degrees. Thus, it can be said that each server may need an average of 853 cu. ft. per hour, or 14.2 cu. ft. per minute average. Thus, total delivery capacity of the regulator must be 28.4 (30) cu. ft. per minute. At six psig (reduced because of loss in the vertical stack of regulators) a total of about one square inch of sharp edge rectangular openings may be used to allow this volume of air. The air valve gate (41) is shown with seven openings of one inch vertical by 0.15 inch width. When open the regulator valve aperture is slightly over one square inch. Thus, from no air flow to about 30 cu. ft. can be realized with this size valve.

The valve controls the flow of cooling air to the area of the ESM (or traditional rack) that contains the equipment being cooled. One possible construction of this valve and a method of operating the valve is described, although many are possible. The valve(s) as described are operated by the action of a bi-metal strip, and may be motor driven and/or otherwise actuated. There are several ways to regulate the operation of this valve or sets of valves. The valve may be set manually, in one example case, but the most common and desirable method is to have an automatic and adjustable regulation method.

The feedback loop being managed is the amount of cooling air required to maintain equipment temperature levels at desired values. This can be controlled via a number of parameters, using each control parameter independently or in conjunction with others. A number of them are described in the filing "Air Based Cooling for Data Center Racks", U.S. Pat. Appl. Pub. No. US2010/0149754-A1 which is hereby incorporated by reference for all purposes. For example, some possible control parameters are power consumption, equipment outlet air temperature, equipment inlet air temperature, equipment internal component temperature (for example CPU temperature), air temperature in selected areas of the rack, (both on the inlet and/or exhaust air side), air flow rate, air flow mass rate, air flow direction, air condensation, back air pressure, infrared levels, etc. These can be measured and incorporated into the invention to regulate the output of the system at the valve or sets of valves in a number of ways, using a variety of communication methods between the control parameter sensors, other environmental or system sensors, the system control logic (which can be centralized and/or distributed, and incorporate command/control and reporting to a centralized management console and/or other facilities/environmental management software systems) and the elements of the system that control the pressure, volume and delivery of the cooling airflow. Note that the sensors (and/or the control logic) can be added to or incorporated into the ESM (or traditional rack) and/or the EDP equipment (many servers already have temperature sensors, for example), as is most advantageous. The communications methods used between the system elements can be varied as needed, for example methods such as wired Ethernet, serial (USB, RS-232, RS-449, many others), X-10, proprietary, many others or wireless (Bluetooth, 802.11, proprietary, many others) can all be used separately or in any combination to enable the system to function effectively in a given facility. A variety of protocols can be used, such as TCP/IP, token ring, proprietary, others, etc. over the wired or wireless communications links. The communications methods can be encrypted and/or use authorization, authentication, and other digital security techniques to ensure higher security if needed. Another example embodiment is described that may use equipment power consumption as the control parameter.

The regulator includes the air valve gate (41), the air valve (3), a pivot point (10) upon which the air valve (30) can pivot, max closed stop (12), max open stop (11), spring (9), push rod (7), bimetallic actuator (50), and wires (60) in series with the power supply input to the electronic equipment being served by this regulator. The regulator (22) is shown in the closed position because no electrical current is being consumed by the electrical equipment, and no current is flowing through the wires (60) and thus through the bimetallic actuator (50). The bimetallic actuator (50) works on the principal that two dissimilar metals bonded together may bend when heat is applied. The bending is a product of the differing coefficients of thermal expansion of each metal. The metal thickness and dimensions are selected such that the total resistance of the electrical current through the bimetal link to electrical flow results in $\frac{1}{10}$ Watt of heat per amp of current. Thus, when current is applied to the bimetallic actuator, the bimetallic actuator may self heat and bend.

Figure 3:
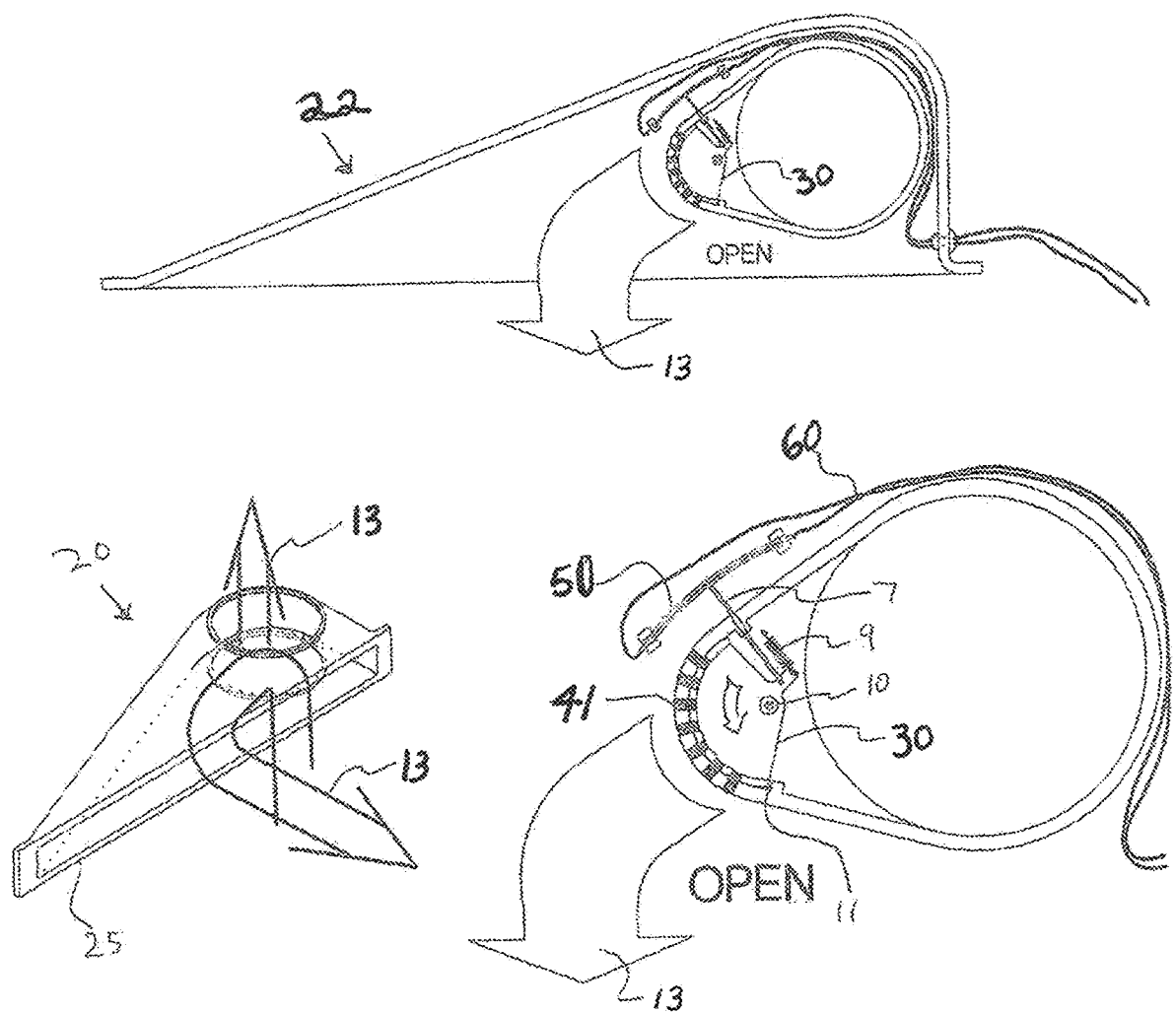
FIG. 3 shows a top view cross section through the horizontal axis of the Air Regulator with a detail view of the major components of the regulator and valve with the valve open, as applied to the example deployment of this invention.

Observing FIG. 3, the air flow (13) is depicted in regulator body (20) flowing both through the module to the next module(s), and being diverted into the equipment mating flange (25) to the EDP equipment. This flow has been initiated by the equipment drawing electrical power, which is passing through wires (60) and through the bimetallic actuator (50). This current has caused the bimetallic actuator to bend from the heating in the direction away from the regulator push rod (7), Spring 9 has acted upon air valve (30) to rotate the valve counter clock wise until the valve has been stopped by the max open stop (11). The rotation of the air valve (30) relative to the openings in the air valve gate (41) now allow alignment of the openings and air to flow. Air now flows at a maximum rate and cooling of the bimetallic actuator (50) begins from the flow of air. The bimetallic regulator (50) flattens out some amount, pushing on the pushrod (7) and in turn rotating the air valve (30) to a slightly more closed position, slowing the flow of air. Air flow continues to be reduced to an equilibrium point where the flow of air is providing only enough cooling to the bimetallic actuator (50) to overcome the heating from the equipment caused by the current through the bimetallic actuator (50). It can be seen that if the equipment current draw was to increase, the bimetallic actuator (50) would heat more, thus bending more, and allowing more air to go through the valve. The application of this combination of actuation and regulation is practicable and very reliable. The application of actuation and regulation also is low cost for construction, but also may be constructed for very high reliability.

FIG. 4 shows a front (40) and back (41) view of the regulator housing (or "plenum housing") illustrating the vertical air duct (14).

Figure 5:
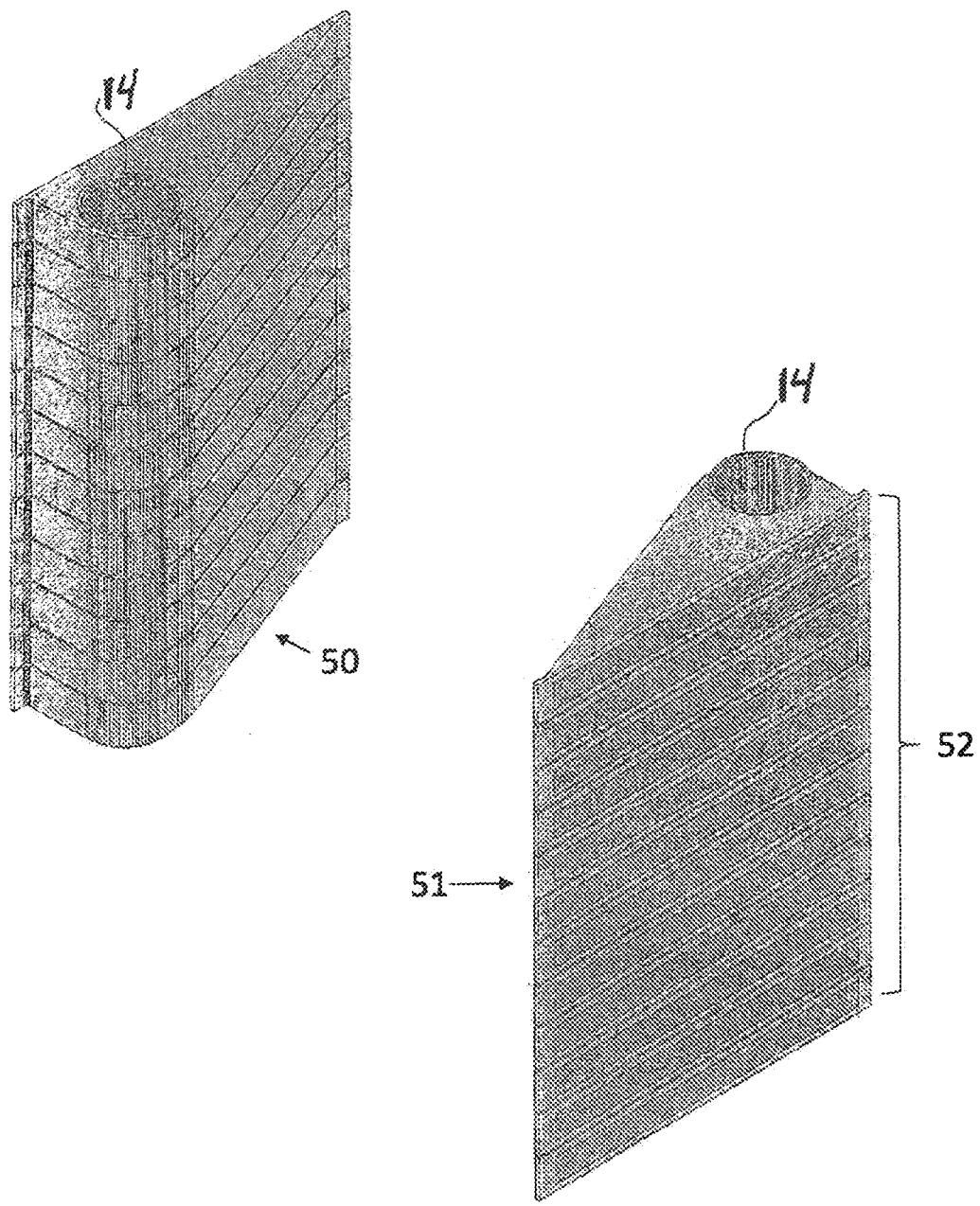
FIG. 5 shows orthogonal depictions of the front and back views of multiple Regulator assemblies stacked into Regulator Modules of 12 regulators each.

FIG. 5 shows an assembly of 12 regulators in a vertical group referred to as a RM. A front view (51) shows the 12 equipment mating flanges (52), each with its own air flow regulator. Again, the vertical air duct (1) (or "pressurized air passageway") is shown. This vertical air duct is defined by a conduit assembly extending through the housings. That is, each housing includes a segment of conduit that aligns with adjacent segments to form vertical air duct 910 when the housings are stacked as illustrated in FIG. 5. A unique feature of this construction is the ability of the precision mating flanges of the verticals column to precisely mate the surfaces of each regulator. The top flange slips into the bottom flange of the next regulator above and fit together. These regulators may be economically constructed due to the design of the valve, and able to be constructed of plastic as well as other materials. The entire case may be made of injection molded plastic, or via a process referred to as blow-molding. Construction with other materials is possible, for example metal or fiberglass, but at a possible cost increase. It can be appreciated that the stacking of the regulators in a vertical fashion is only limited by the ultimate restriction of flow of air through the vertical column to the top, or last regulator. This is approximately 60 modules high at 800 BTU per module and 7 psig. Increasing pressure, or lowering the aggregate cooling load enables variations in the overall stack height. Note that while the current example describes the system in a raised floor data center environment, as noted above, the system can also work in a non-raised floor (on-grade) data center with the distribution manifolds routed overhead and parallel to the rows of racks. In that case the Regulator module stacks carry the cooling air down, not up. Many possible ways may be used to layout the distribution manifolds and connect them to the regulator module stacks. The optimal method(s) may depend on the details of each individual data center or other facility.

Figure 6:
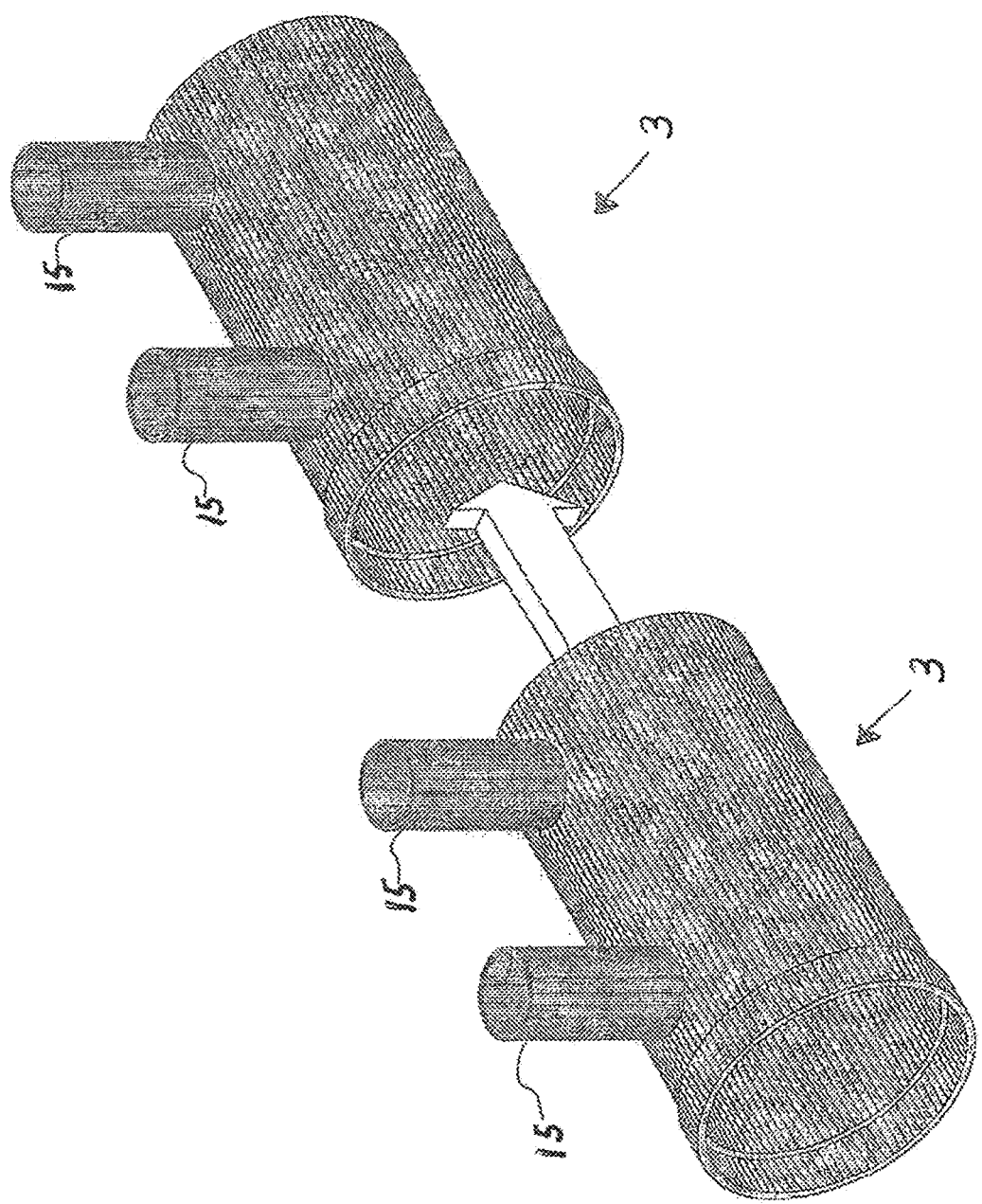
FIG. 6 shows a representation of two sections of an air delivery manifold as it applies to the example deployment of this invention.

FIG. 6 shows a pair of air distribution manifold sections (3). These are the manifolds that deliver air from the compressor to the bottom of the Regulator Module stacks. Each manifold tap has either one or two stacks, depending on the configuration of the layout of rack modules. All of the manifold structures can be made up of commonly available round PVC, ABS or other mass produced plastic pipe materials. Round pipe is selected because of the elevated pressures associated with the outputs of the compressors. Piping of various materials is applicable, but a cost effective preferred instantiation is the use of readily available "sewer" pipe.

If the rack modules are laid out in individual rows, such as would be found in a traditional data center, the single stack per rack riser would be chosen. In the example shown, the stacks (15) are paired, thus delivering air to the back of one Module Stack, and the other stack delivering air to the reversed Module Stack. These air distribution manifold sections (3) can be coupled together for up to as many as thirty rack module pairs in this example.

Figure 7:
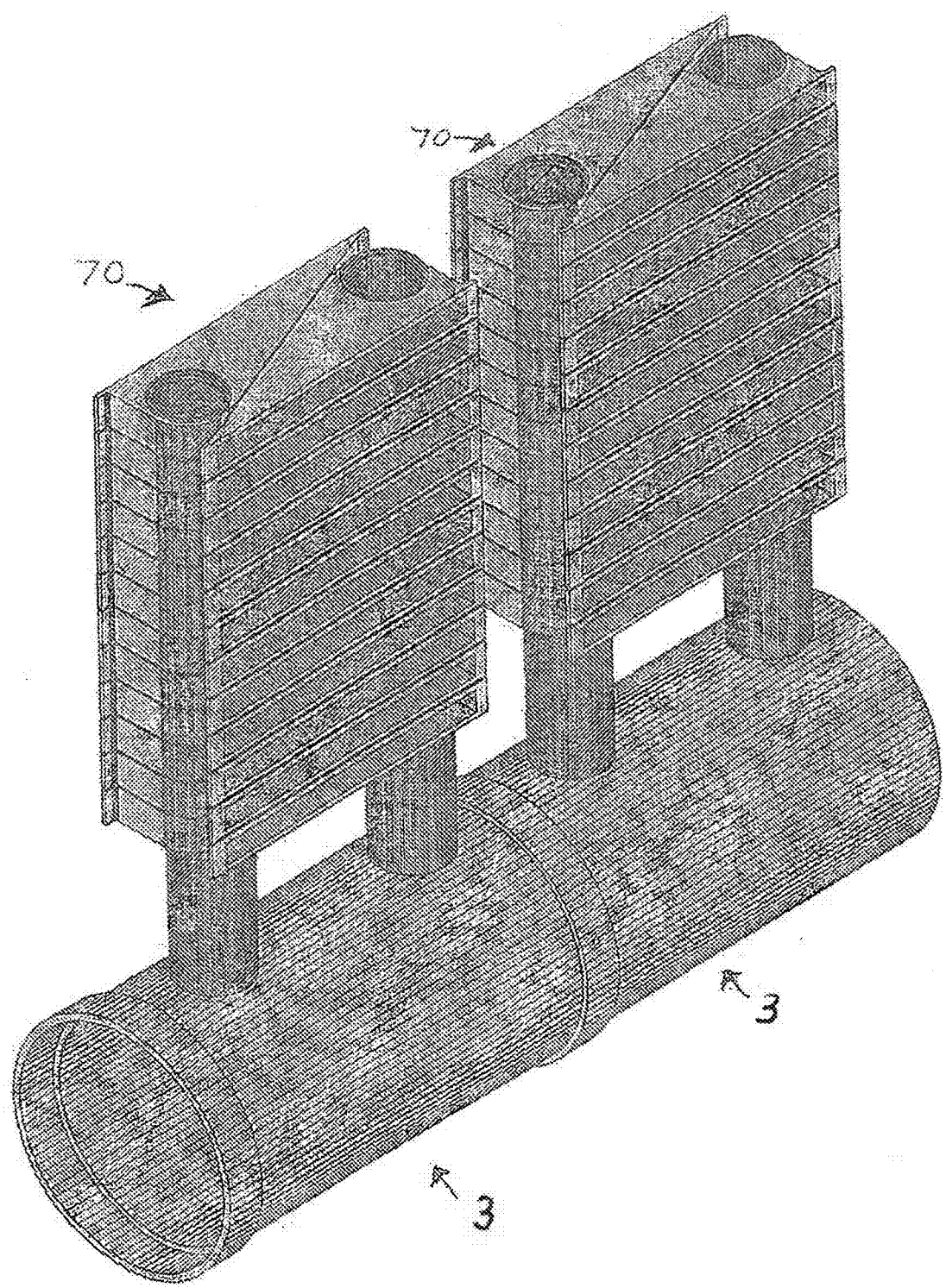
FIG. 7 shows a representation of two sections of an air delivery manifold with a back-to-back paired set of Regulator Modules attached to the tops of the manifold as it applies to the example deployment of this invention.

FIG. 7 shows two sets of paired Regulator Modules (70) on top of the air distribution manifold sections (3). These are the building blocks of the modular system. The distribution manifold is located substantially below the surface of the raised floor, and the Regulator Modules are located substantially above the raised floor of the data center.

Figure 8:
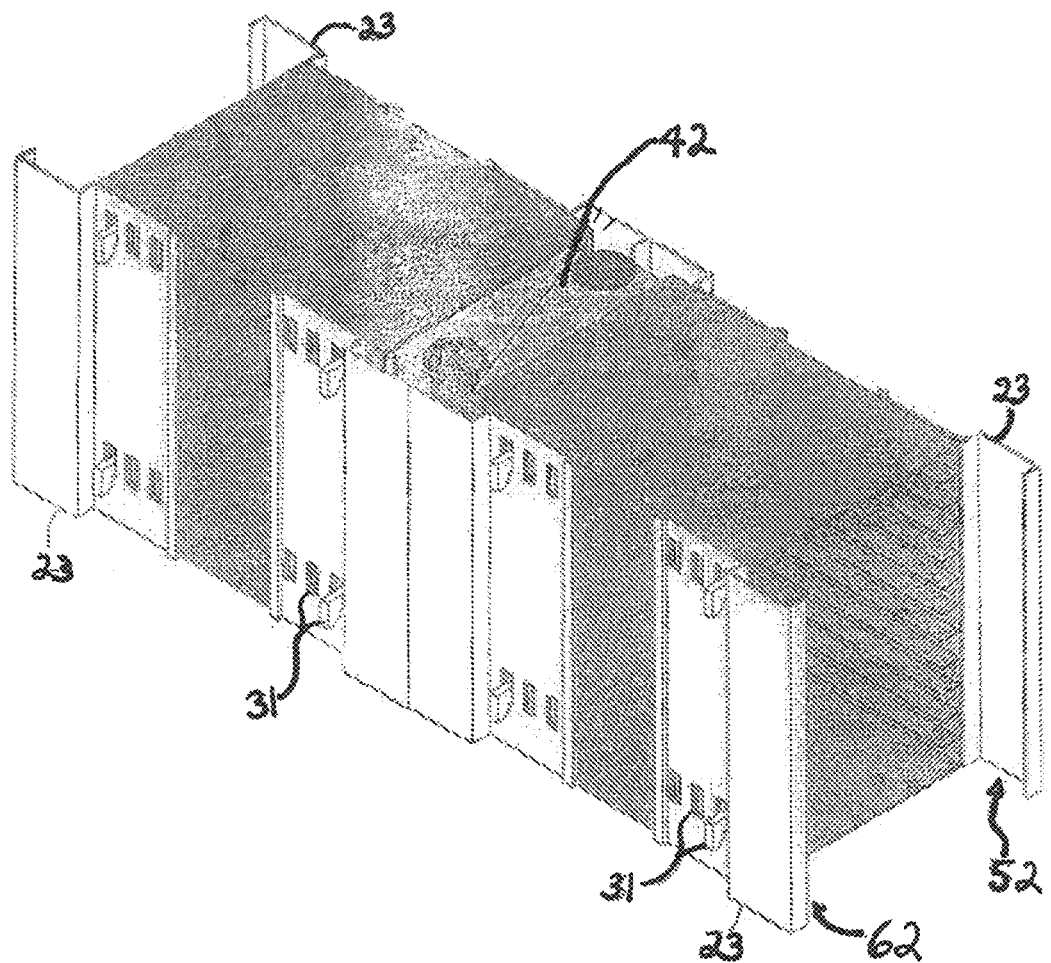
FIG. 8 shows an orthogonal view of a back-to-back pairing of a set of Regulator Manifolds, Equipment Support Modules, and Corner Supports, as applied to the example deployment of this invention.

FIG. 8 depicts the assembly of one paired set of Equipment Support Modules (ESMs) mated with a paired Regulator Module (42), and metal Corner Supports (23), to form a basic paired 12 "U" equipment module, or EM pair (16). The preferred instantiation is deployment of the modules in back-to-back pairs, thus the discussions and figures will depict that configuration. However, it should be noted that pairing is not necessary, and that a single row of modules may be assembled and deployed.

The ESM is supported and securely attached to the Corner Supports (23) with either finger hook and holes (31) or by use of flange head buttons and keyholes, or other mechanical means that allow ease of assembly and disassembly.

The outer Corner Supports have a "U" shaped form (52, 62), a channel, to them that may receive the vertical power and network distribution strips. Note that the channels are arranged such little to no protrusions interfere with the insertion or removal of a piece of equipment from the tabbed ways of the ESM.

Outer Corner Supports (23) can be adjusted with regard to lateral placement on the ESM by selecting one of several (three are shown) openings in the Corner Support for the mating component of the ESM. The variation in depth places the location of the channels of the Corner Support in an optimal location relevant to the depth of the equipment loaded into the racks. In many instances, the depth of the equipment may be slightly longer than the minimum depth configuration of the module. In those instances, the placement of the Corner Support can be adjusted to optimize the finished depth of the stack (rack Assembly) The few inches saved in depth can add up to an additional entire row in large data centers.

Figure 13:
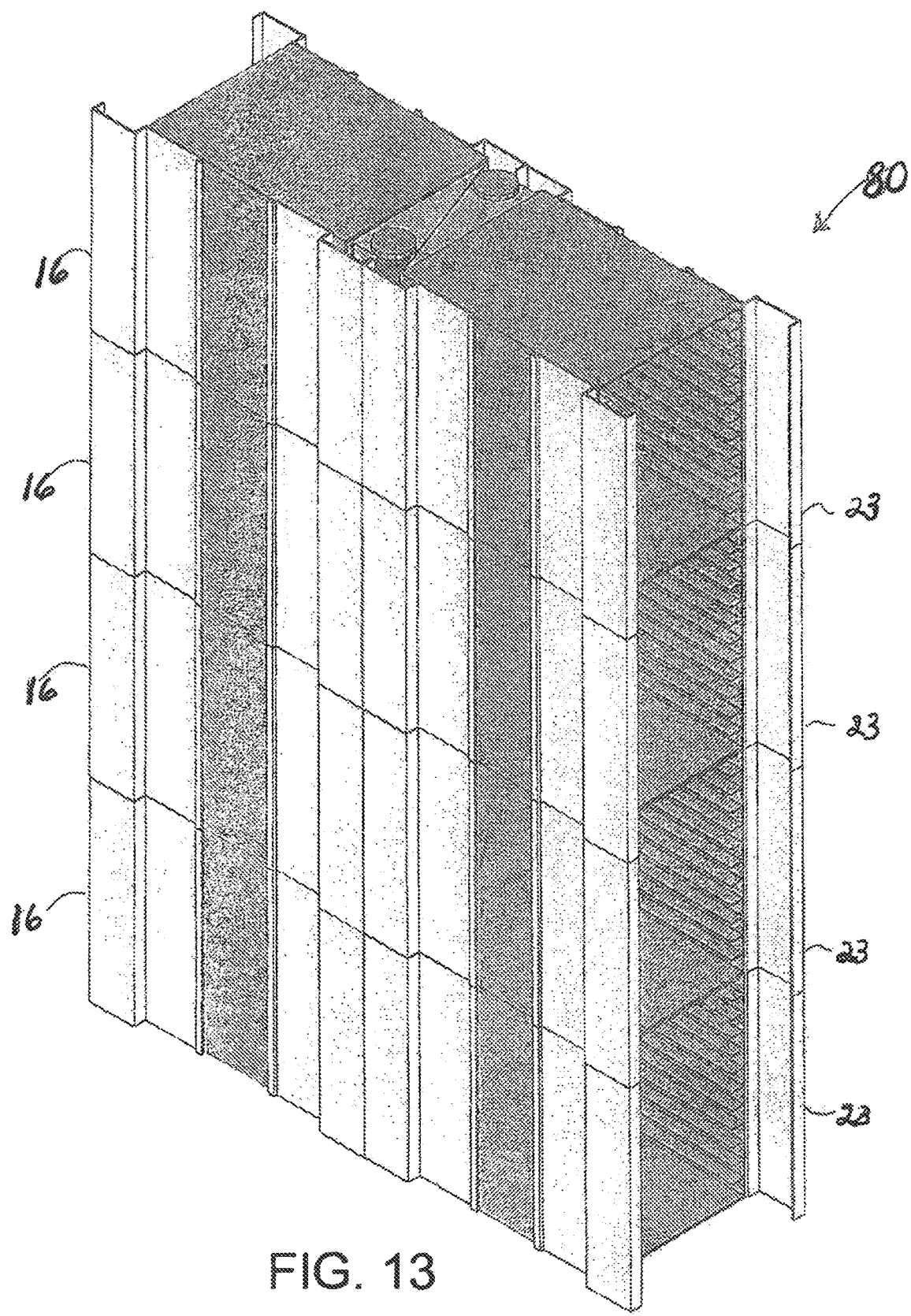
FIG. 13 shows an orthogonal view of a set of paired Equipment Modules stacked into a paired Rack Module of 48 U capacity as it applies to the example deployment of this invention.

FIG. 13 depicts four EM pairs (16) Stacked into a Rack Module (80). Each of the Corner Supports (23) are mechanically attached together by the geometry of the top and bottom of the individual Corner Supports. Various methods can be employed top accomplish this. Simply having formed offsets and slots and guides is an example. The assembly method results in the ability to stack modules securely together.

Figure 11:
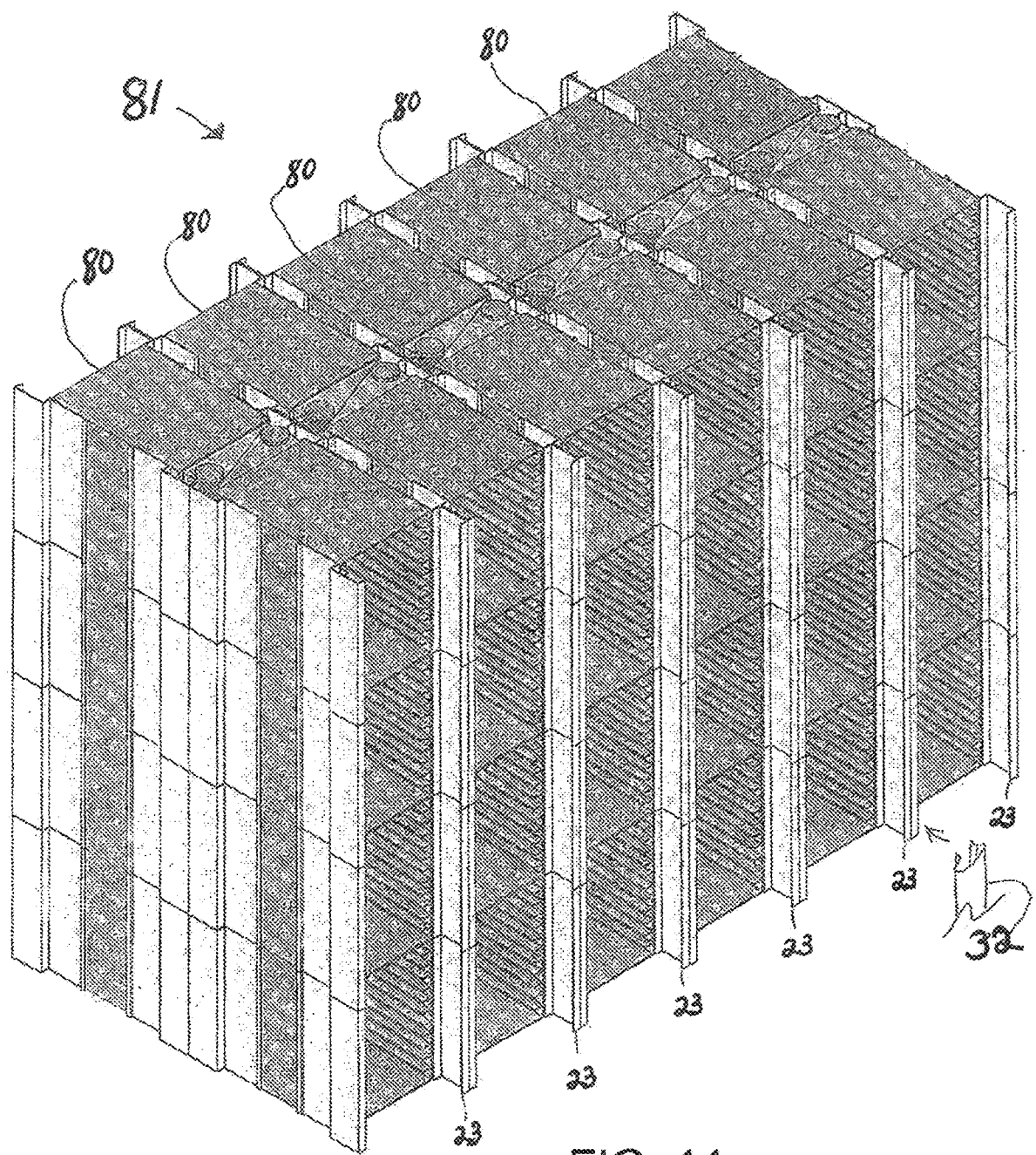
FIG. 11 shows an orthogonal view of t a group of six, paired Rack Modules assembled into a Cell of 288 U capacity as it applies to the example deployment of this invention.

FIG. 11 depicts a six rack "cell" (81). This cell (81) is made up of six Rack Modules (80) that are connected together by snap on locking strips (3) that simply clip over the outer facing edges of the Corner Supports (2). These can be removed, and a single individual RM can be extracted from the Cell (81). This is a desirable feature that allows entire racks to be easily swapped out a production environment for upgrades to be performed elsewhere.

Figure 9:
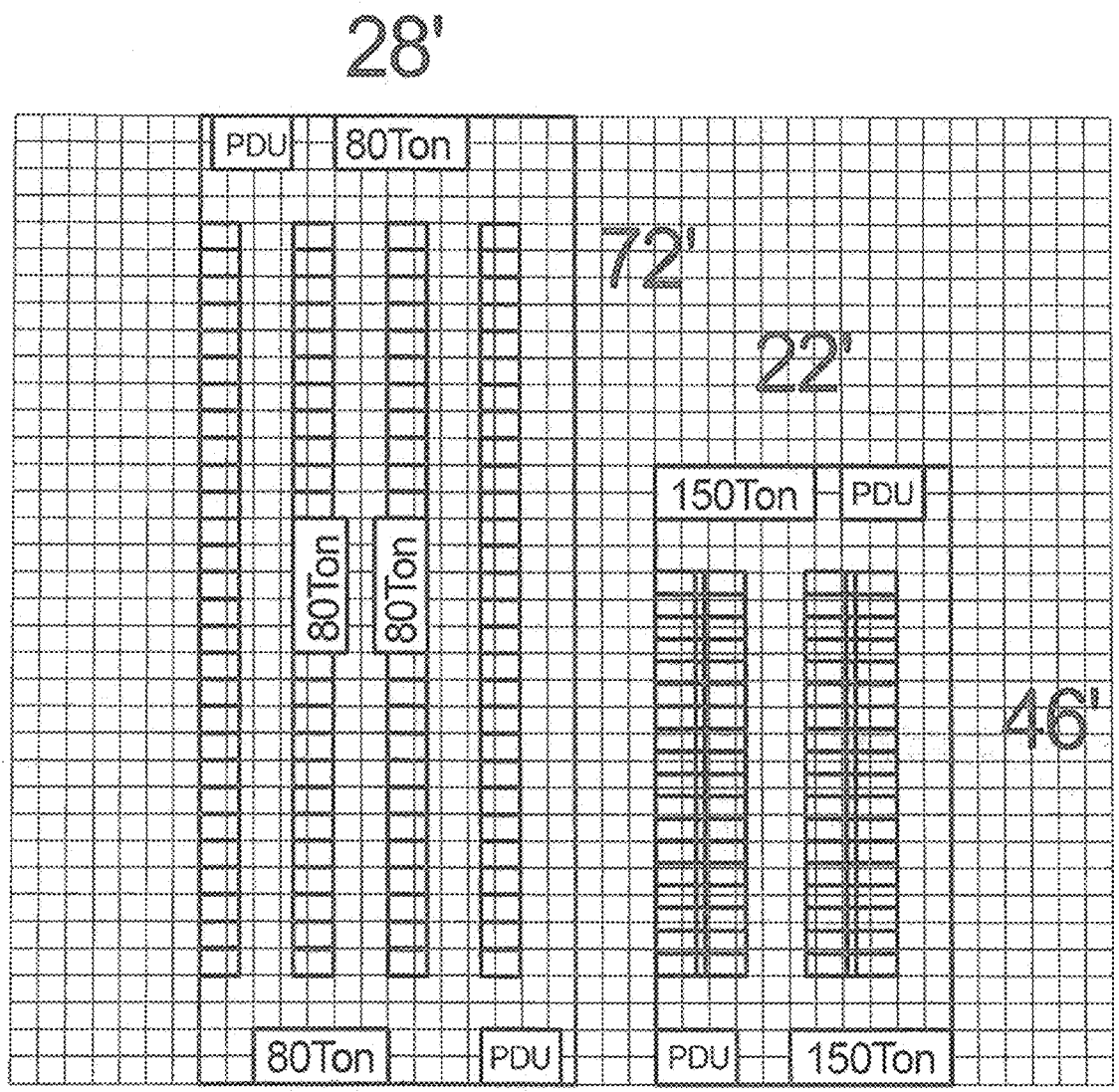
FIG. 9 shows an example comparison of Traditional computer room floor layout with a floor layout of the came total computing resource with respect to floor area as it applies to the example deployment of this invention.

FIG. 9 shows the comparative gain in floor space from the traditional deployment with conventional racks. The grid is representative of the floor tile pattern of 2 ft by 2 foot square floor tiles commonly deployed on raised floor applications. For purpose of comparison only, a ~1 Mega-Watt application is shown in each example. The left example has 98 racks in it, each with equipment (servers or otherwise) utilizing 10 KW per rack. This is above the practical limit, but is at the upper limit of the ability of a conventionally cooled space to operate and currently the predominant conventional high density deployment. This system has been selected for comparison because it represents close to the maximum density achievable without having special cooling apparatus as mentioned earlier (High Pressure Gas, or Water cooling). It should be noted that the methods described in the filing "Air Based Cooling for Data Center Racks," U.S. Pat. Appl. Pub. No. US2010/0149754-A1 which is hereby incorporated by reference for all purposes, can be used with the methods described in this filing, with minor adaptations, to achieve even higher cooling densities. The "Cool-Zonit™ becomes the cooling air source, there are no CRAC units per se. The Regulator modules are adapted to return their exhaust air via the supplemental Cool-Zonit™ return loop.

The racks in the conventional example are 24" wide and 36 inches deep. Of note, a pair of CRAC units are located in the center of the middle two rows. This is because to deliver air at low pressure (less than three inches water), the restrictions under the floor may act to reduce the air supply to the farthest racks. So, CRAC units must be distributed in a manner that allows fairly consistent air supply to all of the corresponding racks that are cooled. Many possible variations of the details of the layout exist, and this example is one representation of a high density option.

In the right hand example, an example of the Modular Deployment System is depicted and is a ~1 Mega Watt example. Both examples have roughly the same compute power, or in excess of 4000 servers. However, the Modular Deployment System, which eliminates much of the unused space utilized by traditional racking systems, has the ability to have rows back-to back, and the ability to have the racks extend up to ~8 foot in height, results in the overall density of servers being compressed nearly two to one with regards to floor space. This essentially doubles the capacity of the data center.

It should be noted that the fans in all of the equipment in this example, in excess of 4000 servers, most of which usually have two to four or more fans in them, are removed or non-operational. This can be done by removing them, disconnecting them, or turning them off in the BIOS on the motherboard (an easy option to add if not available, via a BIOS modification). Some servers with thermostatically controlled fans may not turn on. This is due to the fact that the air is pressurized when the air arrives at the equipment negating or reducing the need for internal fans in the equipment to achieve cooling airflow through the chassis of the equipment. A reasonable, average power consumption for a 1.5 inch high-RPM equipment fan is around 15 Watts. 15 Watts times three (average, but likely very conservative) fans per server, times 4000 servers is 180 KW, which is high. Another point to note is that removing the fans frees space in the server chassis for other components, a useful improvement and the cost of the fans is also removed.

A notable advantage of the invention results from the ability to eliminate internal fans from high-powered EDP equipment such as servers. A limiting factor in the design of CPU chips is the ability of the server enclosure and packaging to remove heat from the CPU chip. Solutions such as heat sinks, heat pipes, etc. have been used to try to manage this issue, but the amount of air that can be directed over or through a heat sink or pipe in a 1 U high server enclosure is limited, by both the space available and the airflow that such small fans can efficiently generate. A server or blade module motherboard that is designed to work in a Modular Deployment System solution has better options. The airflow, being pressurized, can be higher capacity, more effectively directed and have fewer parasitic loss factors like a cooling fan in-path. The motherboard layout can be designed to place components and corresponding cooling arrangements (for example a heat sink and/or heat pipe) in a location for efficient cooling; in the server enclosure, outside the server enclosure in the cooling airstream (e.g., the first component may be in location to be cooled) or a position in which the maximum cooling may be obtained. The regulator geometry may be specifically designed to cool a matched CPU heat sink(s) and/or heat pipe(s) with optimized characteristics for the application. This may allow the development and deployment of higher power CPU chip(s) based servers and/or blade modules. This would be especially advantageous for applications that benefit from more and higher density computing capacity. The fact that the cooling airflow can be filtered upon entry to the cooling air delivery system (at the CRAC unit for example) helps keep dust and other contaminants out of the EDP equipment, another benefit.

The consumption of only 80 KW to operate the four compressors to deliver the pressurized air is a strong net savings. 100 KW is saved, in this example, just by centralizing the air management and pressurization. A 10% or more net gain in efficiency is possible.

Figure 10:
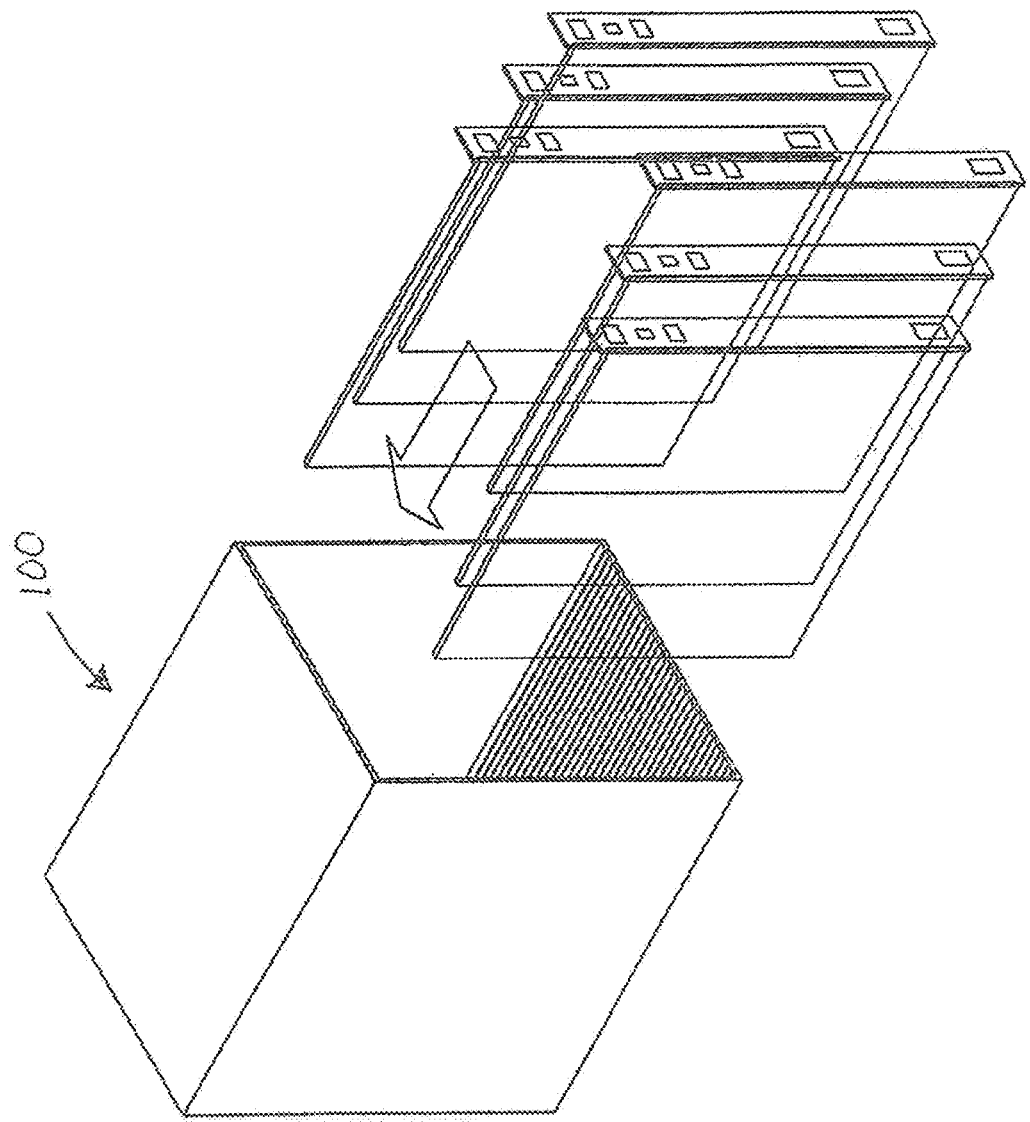
FIG. 10 shows an orthogonal view of an alternate construction of the Equipment Support Module that allows use of "blade servers" directly in the ESM as it applies to the example deployment of this invention.

FIG. 10 depicts a variation of the Equipment Module (100) designed to be applicable to emerging "blade" server applications. A "Blade" server is a computer on a board. The equipment presently manufactured with this technology places multiple Compute Engines in a single box by sharing a power supply and case, sometimes other peripherals, among many Central Processing Units (CPUs). This technology still replicates the box, power supplies, and so forth, for every generation of new server. A generation is about 5 years, when the next generation can economically replacing the existing hardware. This varies, but 5 years is considered to be a reasonable lifetime. But every new generation discards the old cabinet, power supplies, etc. In the modular approach, only the "Blades" need to be upgraded. Because the size of the EM is standard, manufacturers can adapt blade geometry to leverage this standard. This is a more sustainable approach resulting in much less waste in landfills.

Figure 12:
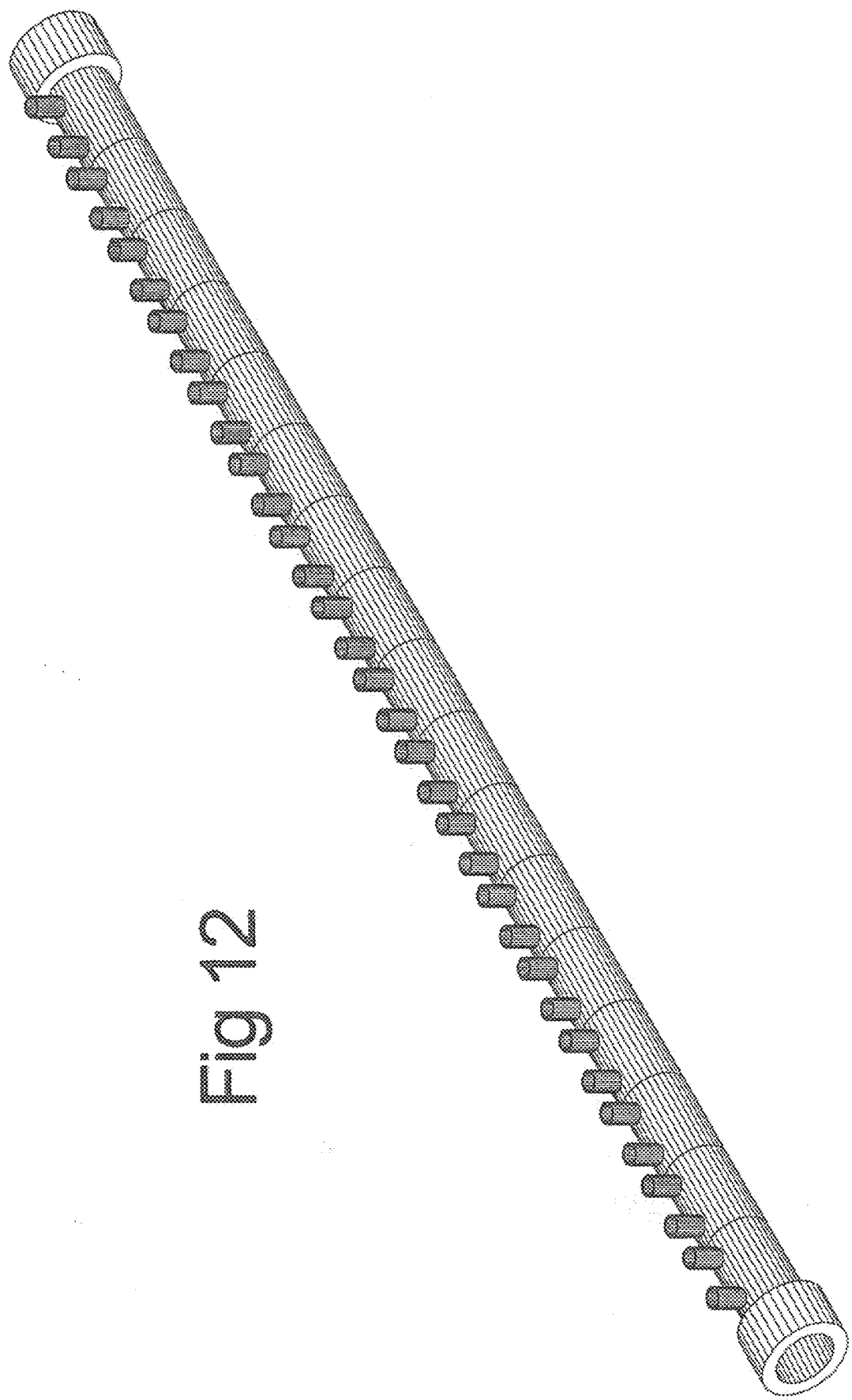
FIG. 12 shows an orthogonal view of an under-floor manifold assembly as applied to the example given in FIG. 9.

FIG. 12 is that of an extended underfloor air distribution manifold as applicable to the example layout shown in FIG. 9. The underfloor air distribution manifold may include Sewer Pipe Tees and stacks, with a compressor module at each end which interfaces with the output of the CRAC units as shown in FIG. 9. The use of two or more CRAC units on one distribution manifold ensures cooling redundancy and makes CRAC maintenance much easier. Appropriate valves can be installed in the distribution manifold to ensure that when one or more CRAC units are off, cooling air is not pumped back into an offline unit. An example of one such valve is shown in the referenced patent filing "Air Based Cooling for Data Center Racks", U.S. Pat. Appl. Pub. No. US2010/0149754-A1.

It should be noted that the methods described in this example allow the design or modification of data centers to place power and network underfloor, due to the method by which cooling is delivered and managed. This in turn, allows for overhead lifting (traveling gantry) apparatus to be installed and used which make for efficient and easy insertion of rack level modules and increases the ability to pack the density of the data center since paths along the floor to move rack modules during installation are not needed.

The system allows for adjustment of the temperature delta (the difference between the cooling air temperature at the individual equipment air inlet and individual equipment air exhaust) for each individual piece of equipment. No other method can do this.

This system allows the shutdown of individual equipment, individual rack modules, or other sub-groups without needing to rebalance the cooling apparatus in the room.

The invention can also easily be adapted to existing data center installations, and may function as described above with a few baseline adaptations. As noted earlier, the system may work with conventional equipment racks (instead of the ESM) which often use traditional plugstrips and network distribution methods.

Figure 14A:
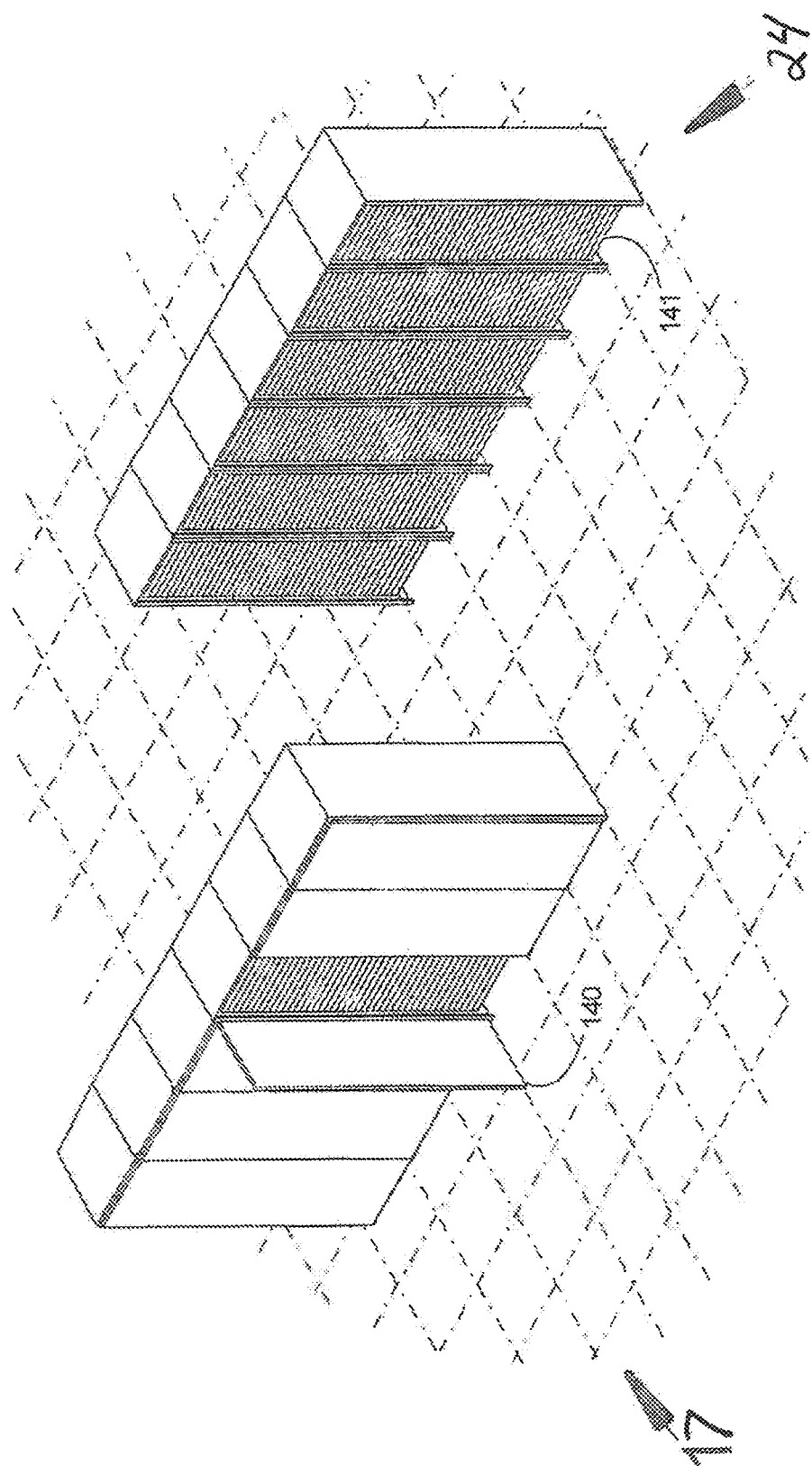
FIG. 14A shows an example set of conventional EDP equipment racks.

For example, in one possible instantiation, FIG. 14A represents a traditional set of six equipment racks with doors (17) and six equipment racks without doors (24). The view represented for this, and subsequent equipment rack examples, is of the front side of the equipment, as this is the side that most equipment uses as the air intake side. The front side also includes user observable indicators and displays. Often, the equipment in the rack is of low enough demand for cooling that a transparent door can be placed in front of the equipment that allows observation of the equipment, and directs air from opening in the floor (or from overhead) to the equipment for cooling, and separates the equipment inlets from ambient air sources that may not be cooled. These doors act as air plenums, directing and isolating airflow. However, as the equipment power consumption may be high enough, this means of air direction may become insufficient.

In general practice, modern data center deployments now utilize equipment with power consumption levels that exceed the capacity of a basic front door plenum, and the front of the equipment is usually exposed to the aisle with doors that can pass cooling airflow or no doors at all. Air is delivered to the aisle in sufficient quantities to deliver needed cooling to the general front of the equipment in large groups as shown in the examples of FIG. 14a. In general practice, the pairs of rows of such equipment faces each other making each pair of rows of equipment having the fronts of the equipment face each other on one row, and backs of equipment rows face each other on alternate rows. This arrangement is generally called hot and cold aisle configuration. As power consumption levels increase in the data center, the ability to manage enough cooling air becomes progressively more difficult, especially when some equipment has lower power dissipation than others, and servicing needs must be performed without shut-down of adjacent equipment.

The example instantiations of the invention described satisfies the need to deliver very high levels of cooling to equipment and racks that need that level of cooling, while maintaining serviceability and optimizing the cooling delivery to the relevant equipment.

FIG. 14a shows a set of six racks, herein referred to as a cell. This cell may be any number of racks, the number of which is determined by the limitations of the air-cooling support equipment. For example, if the individual racks dissipate upwards of 35,000 Watt-hours (35 KW) of heat, then each rack is going to require about 10 Tons of cooling per rack. Assuming that the cooling equipment in this example is capable of delivering 60 Tons of cooling, then six racks would be the subset, and hence the cell size for the application. Of note, the modulus of the available cooling equipment to the cell size is a direct relationship of the capacity of the attached cooling equipment to the power dissipation total of the racks. Thus, various combinations of cooling equipment and individual racks power dissipation needs may determine the size of each cell. The modular design of this invention accommodates that simply by determining the number of taps into the main plenum served by the cooling equipment that each cell has. In this, and subsequent examples each rack is loaded with between 42 and 45 individual pieces of equipment (141). This number can vary, and it is possible, even likely, many racks may contain fewer pieces of equipment. Some racks may even be empty. Some racks may be full, but all of the equipment powered off. It is desirable that the air delivery system be able to adjust to these variables dynamically and preferably automatically.

Figure 14B:
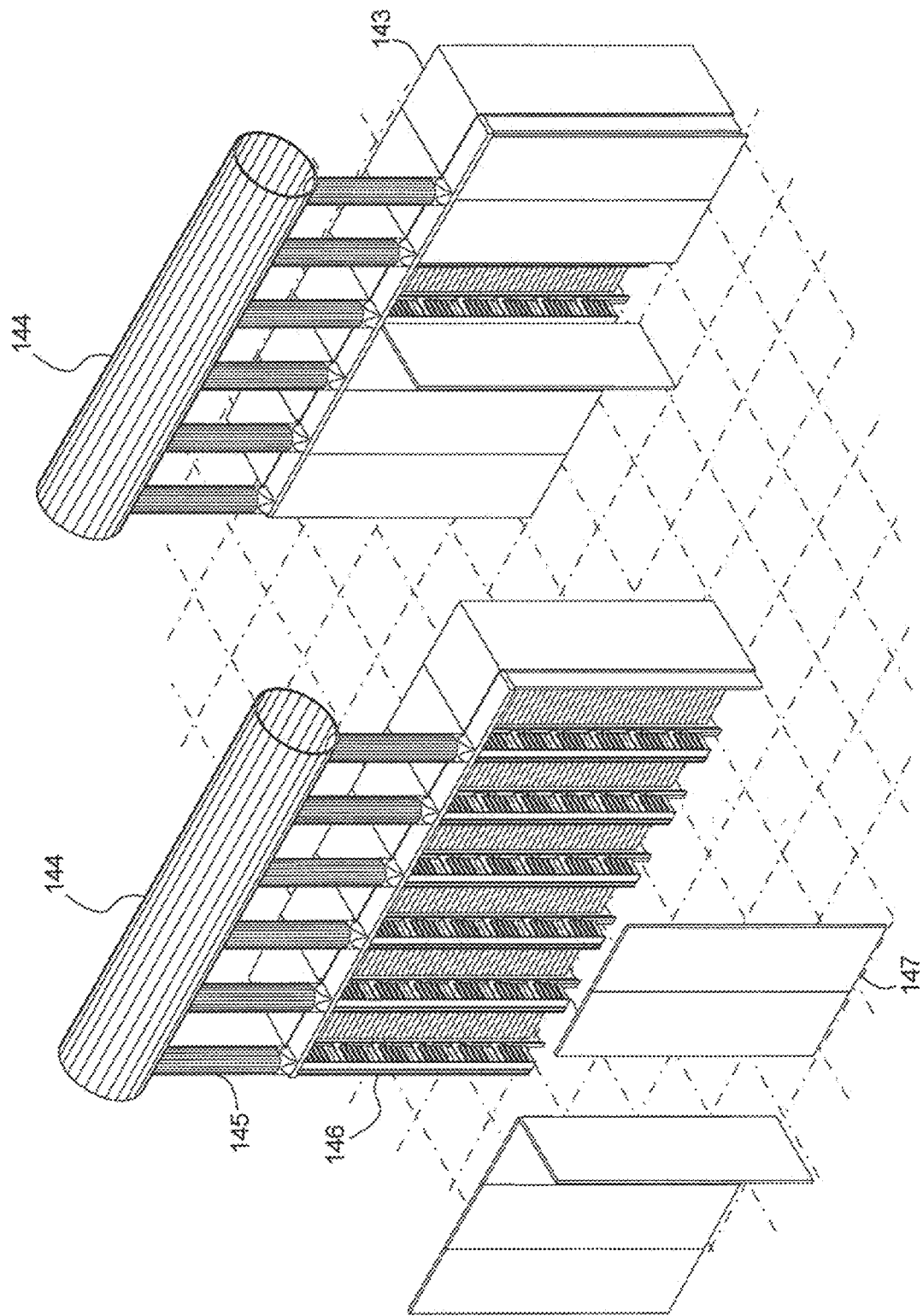
FIG. 14B shows an example set of conventional EDP equipment racks with associated overhead Modular Distribution System distribution manifolds and attached Regulator Modules.
Figure 14C:
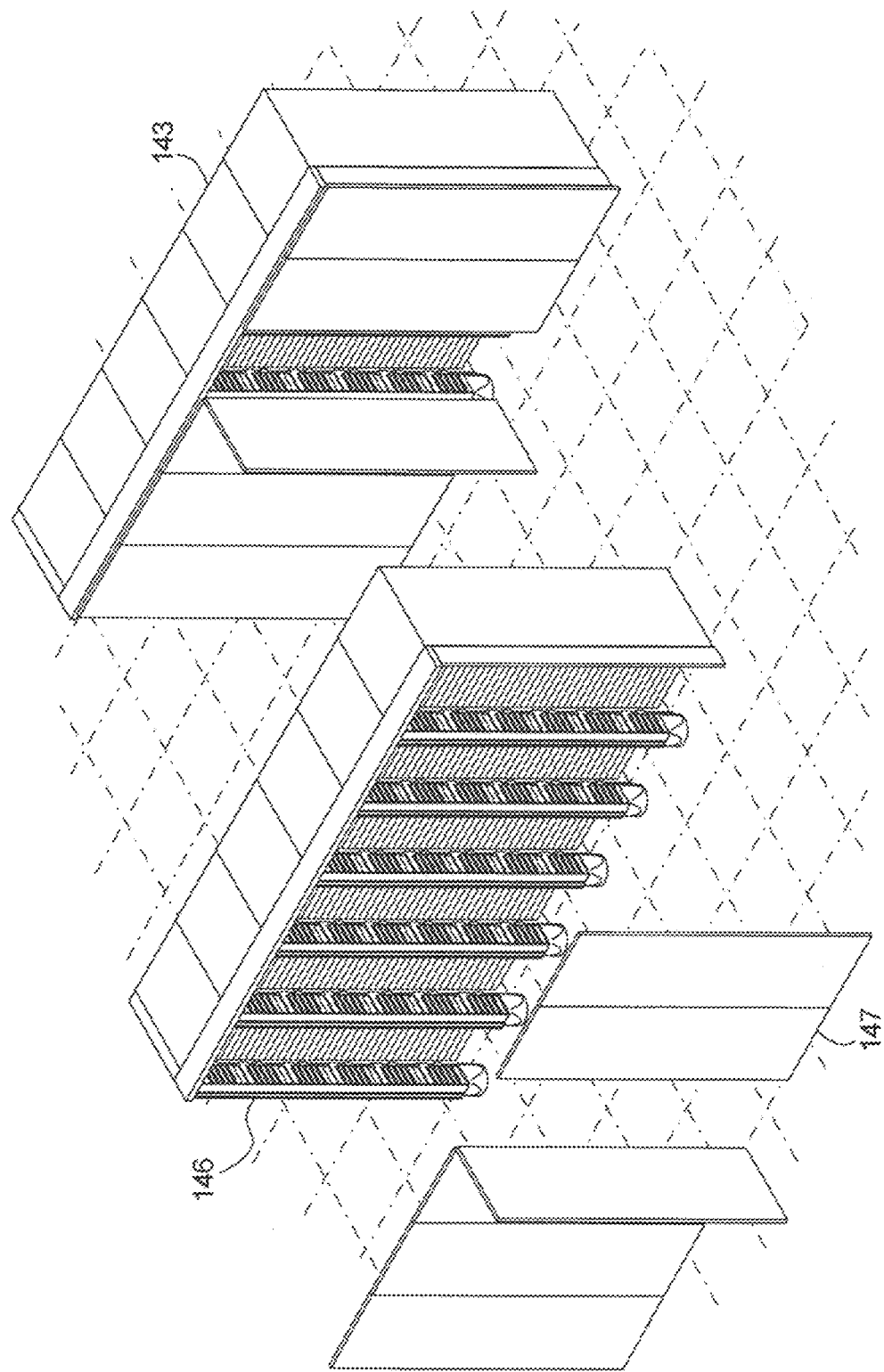
FIG. 14C shows an example set of conventional EDP equipment racks with associated underfloor Modular Distribution System distribution manifolds (hidden) and attached Regulator Modules.

FIGS. 14b and 14c show 2 instantiations of the invention in both overhead air delivery configurations (14b) and under-floor air delivery configurations (14c). Principal components shown in FIG. 14b are 1) rack cell (143), 2) overhead horizontal air delivery plenum (144), 3) regulator branch feeder ducts (145), 4) vertical regulator assemblies (146), 5) and cover doors (147). It should be noted that these are components of a six rack cell, but any combination of racks may be utilized. The view is shown with one rack door open. The grid at the floor line is representative of a traditional raised floor tile pattern and may or may not be utilized in an overhead delivery manifold configuration. Principal components shown in FIG. 14c are 1) rack cell (143), vertical regulator assemblies (146), and cover doors (147).

The delivery of air to the vertical regulator assemblies from the Horizontal plenum is assumed and is described in: U.S. Patent Application Publication Nos. US2010/0149754-A1 and U.S. 2010/0142544-A1. For the purpose of this description, the components of interest are the vertical regulator assemblies and the associated hardware. The purpose of this instantiation of the system is to deliver air in a regulated fashion to EDP equipment in conventional electronic data processing racks.

Figure 14D:
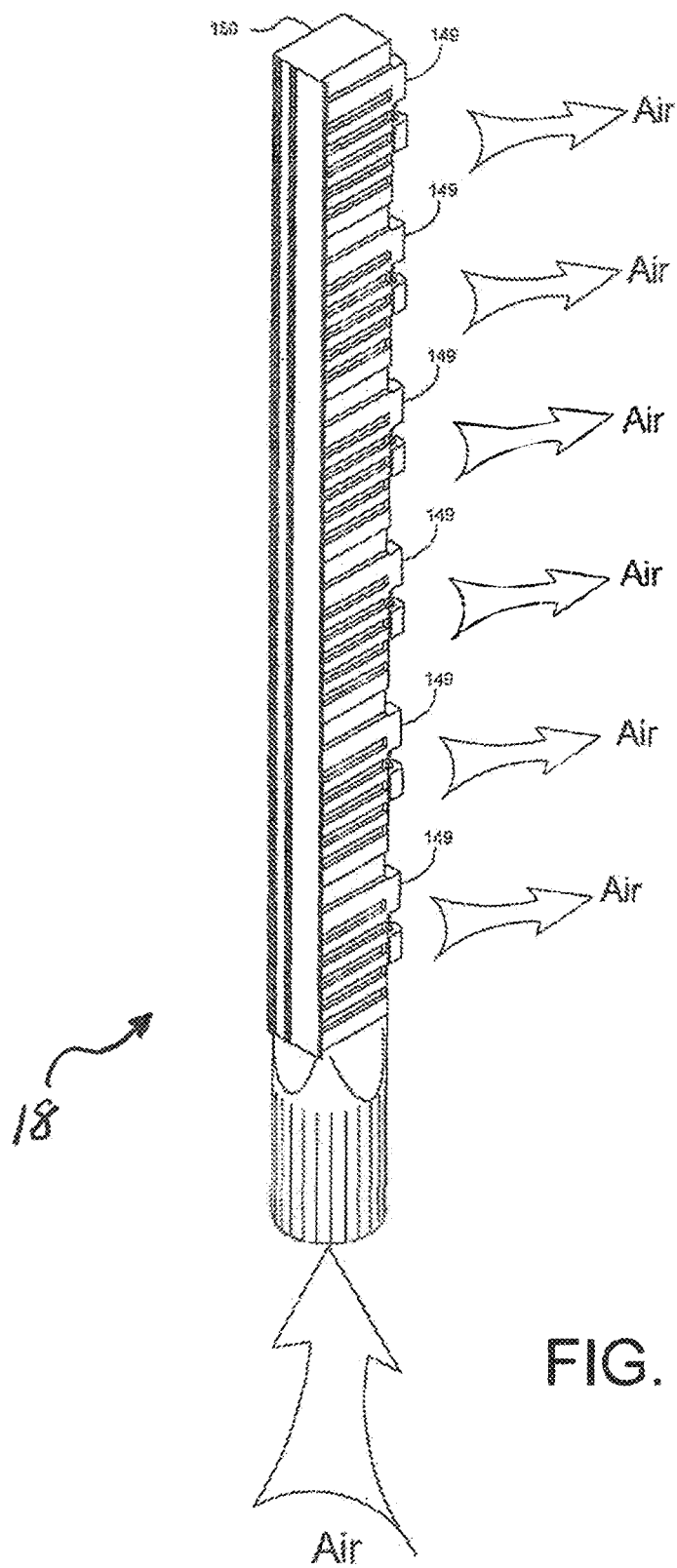
FIG. 14D shows an example Regulator Module fed from an underfloor distribution manifold.

FIG. 14d represents a principal component of this instantiation of the invention. The vertical regulator assembly (18) is shown and includes six individually adjustable valve gates (149) attached to the primary riser duct (150). The individual adjustable valve gates are driven by a small electric motor to operable to either an open, closed, or any in-between position. The airflow to a region within the vertical space of the cooling air intakes of the EDP equipment can thus be regulated. This feature allows regulating the amount of cooling air to one or more servers. The vertical regulator assembly (18) is not restricted to six regulators, rather, the optimum number of regulators is a function of the desired level of efficiency. More regulators (at a higher cost of manufacturing) may result in a higher efficiency for environments that experience regular shut-down or maintenance of individual servers, or where the servers in a given rack have a wide distribution of power consumption. In those cases, a vertical regulator assembly with a higher number of smaller adjustable valve gates would be desirable. On the contrary, if a server rack is configured with identical equipment, where the load presented is uniform from top to bottom, and/or the server rack is maintained or experiences shutdowns on a rack-wide basis, such as in a fully redundant server farm, the number of adjustable valve gates may be reduced to as few as one large gate operated by a single motor. In this example instantiation, six adjustable gate valves (140) may be a reasonable median.

Figure 14E:
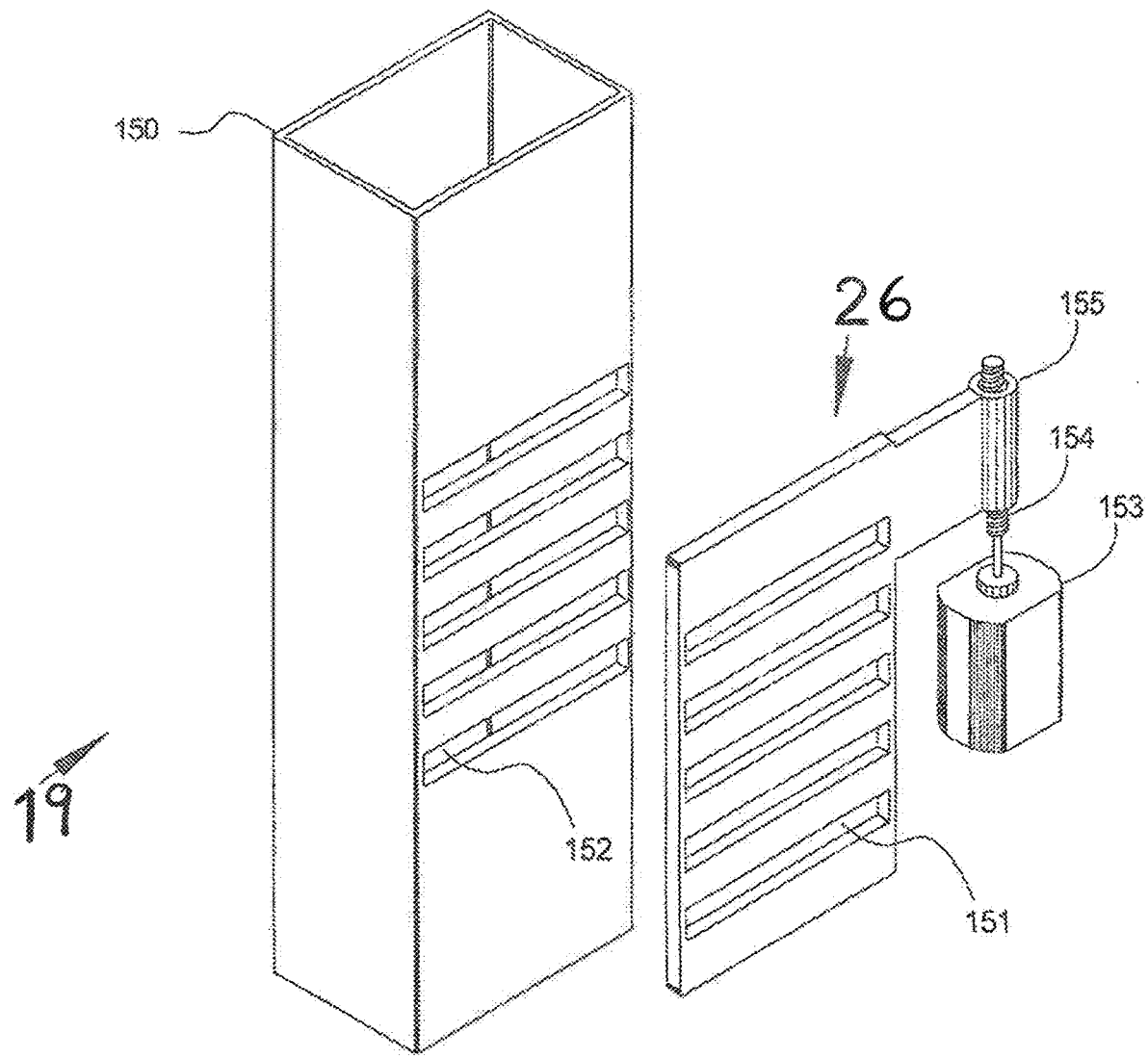
FIG. 14E shows a representation of an example regulator valve.

FIG. 14e shows a simplified representation of a single regulator valve section (19) with the gate (26) separated for clarification of its method of operation. Slots (152) are cut in the primary riser duct perpendicular to the long axis of the duct as shown. The size and shape of these slots can be varied to suit desired air-flow needs. The operation of the valve is performed by energizing the electric motor (153), thus turning a threaded screw (154) in a threaded nut (155) which is part of the gate (26). The motor (153) is affixed to the primary riser duct (150) by some suitable means. Thus, when the motor is energized in one direction, the rotation of the screw (154) in the nut (1550 results in the gate being moved up and down. The gate is held in place by slides, not shown. As the gate slides up and down in response to the action of the motor, the slots (151, 152) align or misalign, as the case may be. Thus, by operating the motor, a position can be selected from completely off for air-flow to completely on for air-flow by electrical means.

Figure 14F:
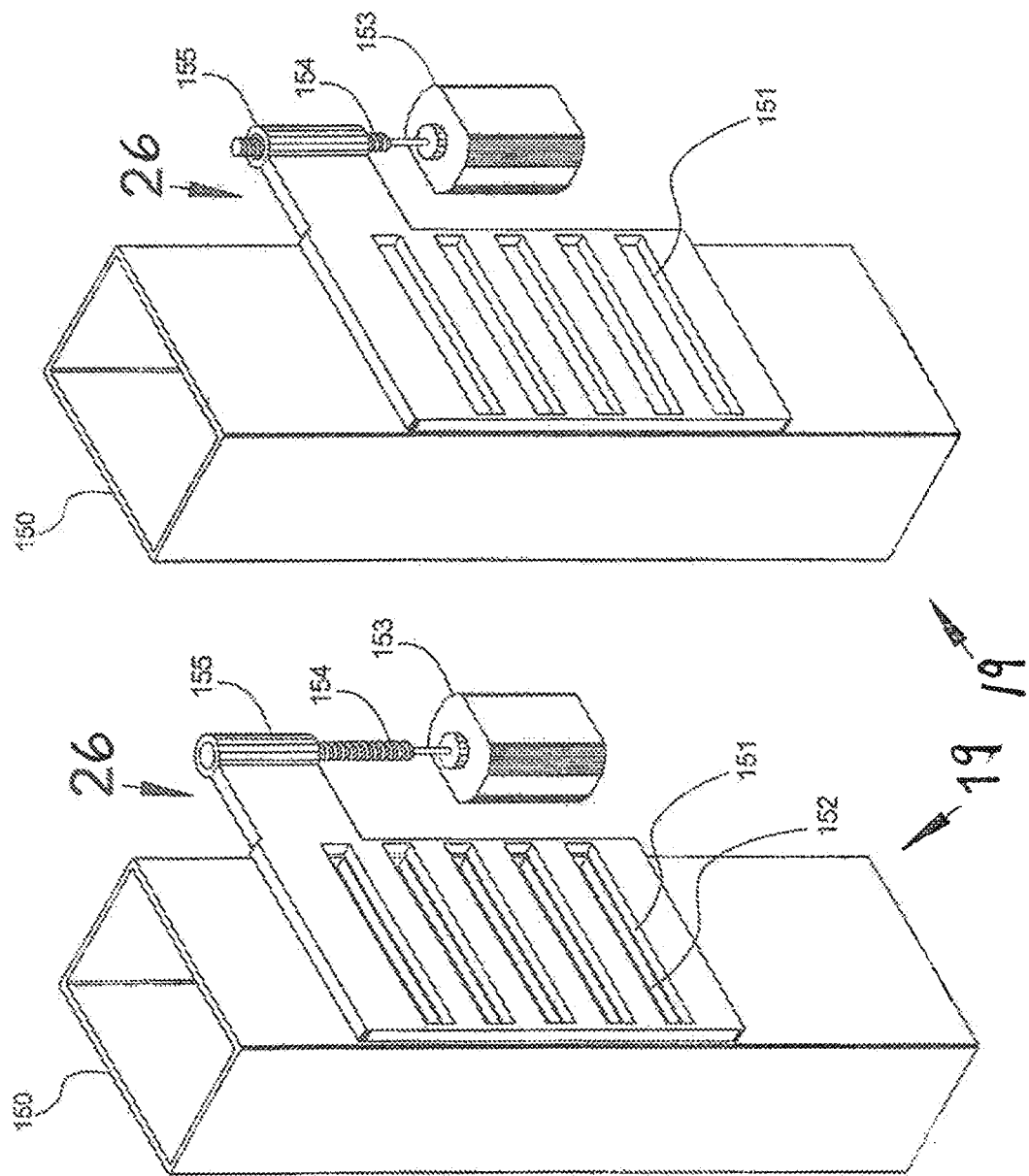
FIG. 14F shows another representation of an example regulator valve.

FIG. 14f shows a simplified representation of a pair of single regulator valve sections (19) with the gate (26) in the assembled position side by side for clarification of the method of operation in the open and closed positions. The regulator valve section (19) on the left shows that when the motor (153) has been turned one direction, the gate (26) is positioned so the slots (151) in the gate (26) align substantially with the slots (152) of the primary riser duct (150), thus allowing maximum airflow out of the duct. The regulator section (19) on the right shows that when the motor (153) has been turned another direction, the gate (26) is positioned so the slots (151) in the gate (26) do not align substantially with the slots (not visible) of the primary riser duct (150), thus minimizing airflow out of the duct.

Figure 15A:
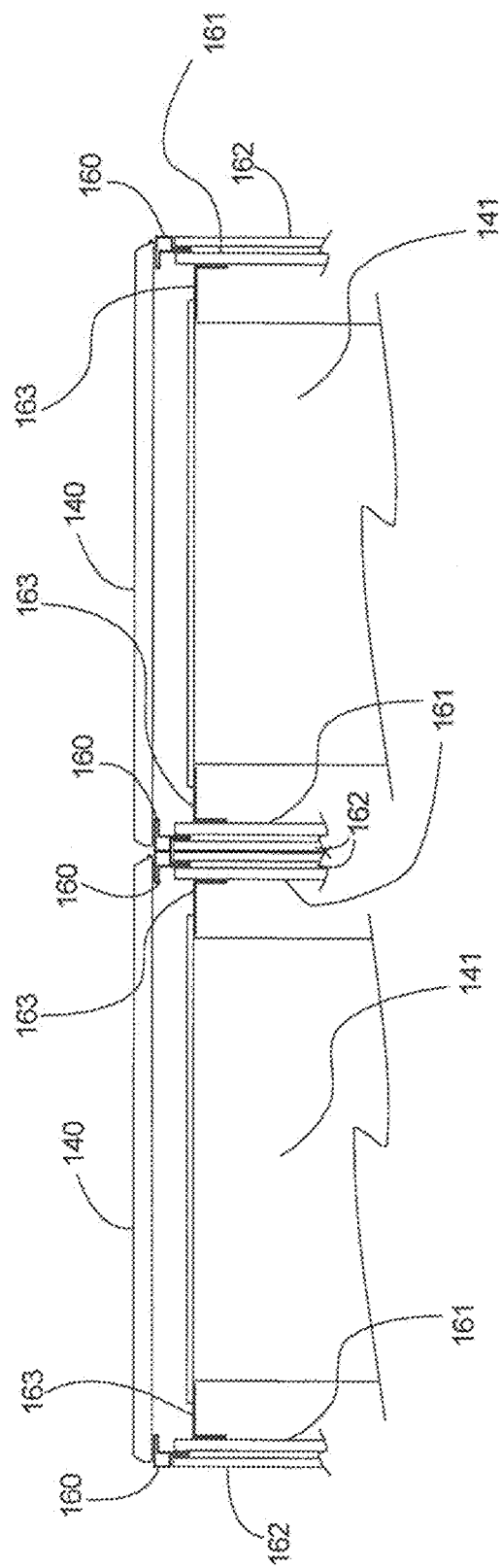
FIG. 15A shows an example of a cross section of a set of equipment racks.

FIG. 15a represents a cross section view of a subset of two racks of the six racks shown in FIG. 14a. This cross section shown in FIG. 15a is representative of numerous manufacturers rack construction means. This traditional and well proven arrangement is used to efficiently and securely house end user electronic data processing (EDP) equipment (141). The rack components of interest are the main frame shell posts (160), horizontal rail supports (161), outer skin panels (162), vertical equipment mounting rails (163), front doors (140), and the end user EDP equipment (141). This view does not have any components of the invention but helps define the parts to be attached to by the invention. Note that the doors are hinged on the right side, the details of the hinge are not shown, these vary from manufacturer to manufacturer. The representative EDP equipment is shown with the front side of the equipment only, and the back half of the equipment and the rack are not shown. The front side of the EDP equipment is of interest, as nearly all modern EDP equipment has air intakes on this side.

Figure 15B:
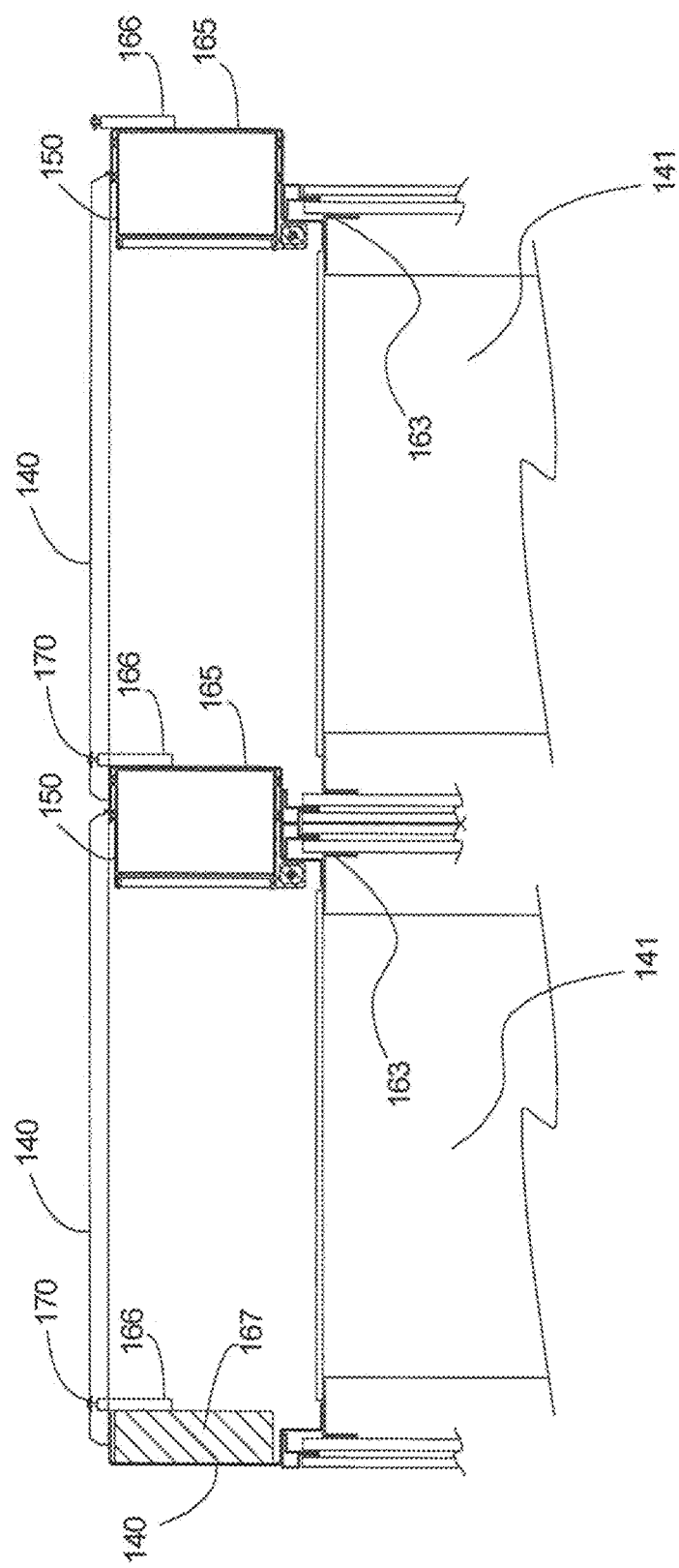
FIG. 15B shows an example of a cross section of a set of equipment racks with components of the Modular Deployment System added.

FIG. 15b represents a cross section view of a subset of two racks of the six racks shown in FIG. 14b, and is the same cross section of the two racks shown in FIG. 15a, but with components of this instantiation of the invention added. This instantiation is intended as a retro-fit to existing EDP equipment rack systems. To generalize this example for universal use, mounting to the racks is optimally done at the one location in the rack that is standard among all the manufacturers, specifically the vertical equipment mounting rails (163). No other NEMA rack dimension (height, total width, depth) is universally standardized. The only standard dimension is the width between the vertical mounting brackets. Otherwise, for adaption to a specific rack or family of racks, a number of attachment methods may be used. An adapter bracket (165) is attached to the vertical equipment mounting rails (163) and supports the vertical regulator assemblies (150) previously represented in FIG. 14d. Air delivered by the vertical regulator assembly (150) into the cavity in front of the EDP equipment (141) is then drawn into the EDP equipment (141) by the built in fans of that equipment. It is assumed the manufacturers of the EDP equipment have sized the flow rate of the integral fans such that adequate cooling may be provided if sufficient ambient pressure air is available.

A set of air flow detectors (166) are shown and located such that one end of the air flow sensor is located within the cavity, and one end penetrates the door (140) through a small opening in the door (170). The far right sensor is present in the example in which an adjoining rack is present, as it likely would be. The air flow sensors (166) are capable of detecting very small changes in the direction (and possibly amount) of air flow through them. If the air pressure inside of the cavity is even slightly higher than the ambient pressure on the other side of the door (140), the air flow detector (166) may detect this and sends the signal to electronics which in turn slightly closes the gate on the associated valve on the vertical regulator assembly (150). The reduced volume of air into the cavity then reduces or stops the flow of air through the air flow detector (166). The key point is that the bi-directional air flow sensing capability of this sensor allows accurate detection of the null point (pressure balanced inside and outside the rack) to manage the cooling airflow. This method of regulating the air flow ensures that the ambient pressure at the intake of the EDP equipment (141) is equalized with the ambient pressure on the discharge side of the EDP equipment (141). This method of regulation does not require external temperature measurement sensors, is self-contained, practicable, and robust. In some examples, it can modified for redundancy for greater reliability. If a single piece, or a set of EDP equipment in a given rack is turned off, the pressure may rise since the fans of the EDP equipment have shut off, and the regulators may automatically compensate. If the EDP equipment has internal temperature sensors that speed up, or slow down the internal fans, the resulting air pressure may be affected at the intake and may result in the vertical regulator assemblies (150) compensating.

It should be noted that this method of air flow regulation is novel and may be used in a variety of systems, with a number of cooling (or heating air for systems that heat via air, not cool) airflow delivery mechanisms, besides the invention described herein. It is a very efficient way of regulating the flow of cooling air to the cooling intakes of the EDP equipment mounted in the rack, because the method presented tends to deliver just enough air to the cooling air intakes as is needed. The nature of the control parameter ensures that the amount of cooling air delivered is sufficient and no more. The location and operation of the airflow direction sensors may be adapted to other cooling air input mechanisms. In one example, a conventional raised floor with one or more damper valve controlled input tiles may be positioned under the rack to allow cooling air to flow toward the front of the mounted EDP equipment (or up the front of the rack if there is no door or a door that passes cooling air or even draws the cooling air in via fans in the door which may be controlled by the airflow sensors to ensure enough cooling air is drawn inside). The airflow sensor locations may be placed to ensure that the equipment farthest from the cooling air input tile (for example in a raised floor data center, usually the EDP equipment mounted highest in the rack) had sufficient cooling airflow. This would not be as efficient as the instantiation of the invention presented, since that instantiation can control cooling airflow for each EDP equipment location in the rack, but it may be more efficient (and easier to implement and manage) than many existing cooling airflow systems that rely on manual settings or temperature measurements. The output of one or more CRAC units (and therefore the air pressure and temperature of the cooling air) into the raised floor plenum (or ambient air for an on-grade data center) may also be controlled from a set or subset of airflow direction sensors in a set or subset of rack(s). This method allows the user to select the racks that would tend to have hot-spots (for whatever reason, such as type of EDP equipment mounted, distance from CRAC units, airflow path from the CRAC units to the racks, etc.) and use them as the regulating points for the output of the CRAC units. The communication methods between the sensors and other system elements (dampers and CRAC units, etc.) may be accomplished as already described.

Figure 15C:
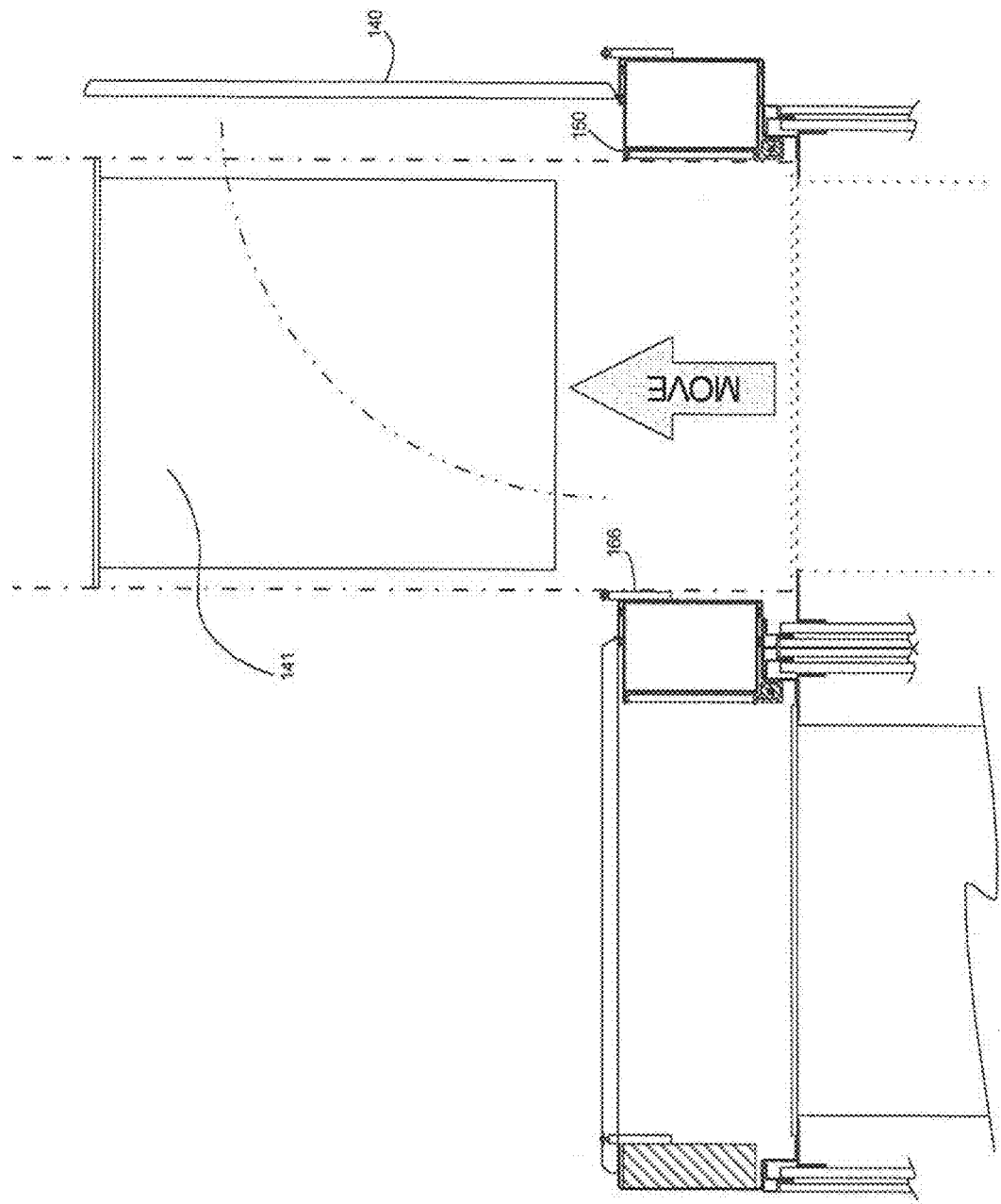
FIG. 15C shows an example of the operation of the system when the EDP equipment rack door is open for access to the equipment in the rack or to move equipment into, out of or within the rack.

FIG. 15c shows an additional unique feature of the invention. The door (140) has been opened and the EDP equipment (141) is being removed. This is typically accomplished from the front of the rack as shown. In this case, the EDP equipment above and below the removed EDP equipment must remain on and continue to have cooling delivered. This invention supplies the adequate air even with the door (140) open. This is due to the fact that prior to the door (141) opening, the exact same amount of air needed by the EDP equipment was being delivered to the cavity in front of the EDP equipment. Thus, little or no pressure difference between the cavity and ambient. When the door is opened, there may be little if any cold air contamination, as the EDP equipment may be drawing in exactly as much air as the vertical regulator assembly was delivering prior to the door being opened. Since the door is no longer in place adjacent to the air-flow sensors, any tendency for air to move through the sensors may be reduced and/or minimized and the regulators may stay in the same position as prior to the opening of the door. It is also a feature of the invention that the space between the racks, approximately from the edge of the path of extraction of adjacent EDP equipment to the near edge of the local EDP equipment is nearly fully utilized for the cross section of the vertical regulator air plenum. The rectangular cross section optimizes the usage of the available space and allows for the minimum profile projection of the system after it is added to the original rack dimension.

Figure 16A:
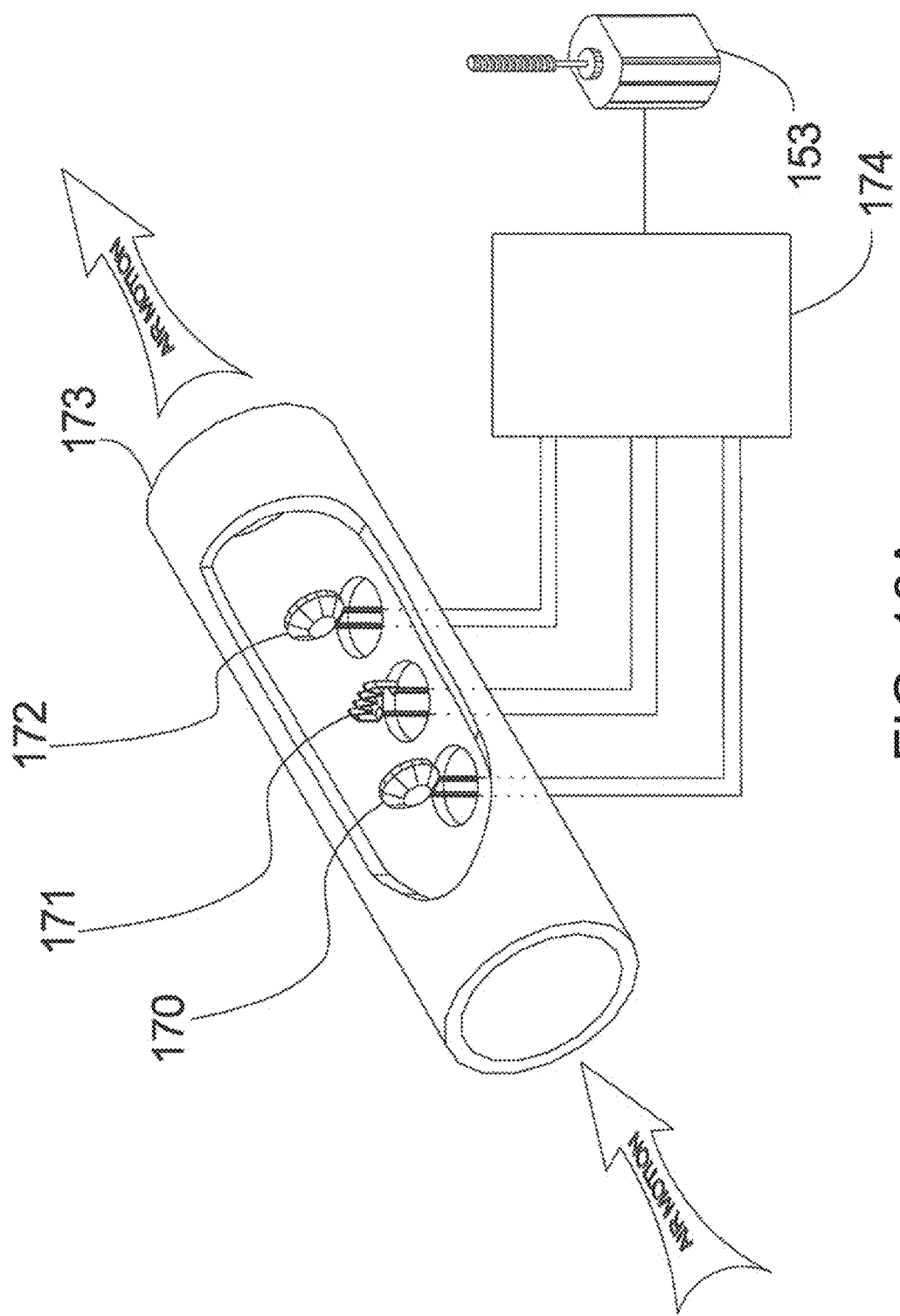
FIG. 16A shows an example of an air flow sensor.

FIG. 16a is an example representation of one possible instantiation of the air flow detectors. This example includes two thermistors (170, 172), and a resistive heating element (171) substantially surrounded by a tube (173), which is shown in cut-away to make the components visible, in which the direction of the air flow through the tube is to be detected. In the example air is shown flowing from left to right through the tube. Also shown is an example electronic servo control (174) and gate control motor (153). Control of the motor is accomplished by detecting the flow of air from inside the equipment cavity to the outside ambient through the door as described earlier. The actual detection of the air flow is accomplished by the detector by measuring the temperature difference between the two thermistors (170, 172). A small heating element (171) is placed between the two thermistors (170, 172) and heated slightly above ambient. If air flows as shown, through the tube and across the near thermistor (170), then across the heating element (171), and then across the far thermistor (172), the near thermistor (171) may be cooler than the far thermistor (172), and this can be detected by electronic servo (174) and an adjustment sent to the gate control motor (153). This method of detecting airflow can be very sensitive, as only a slight air motion may upset the balance of the two thermistors. In addition, because the two thermistors can also be used to detect the average local air temperature, e.g. the average temperature in the space inside the tube around and near the heating element (171), the servo can regulate the temperature of the heating element (171) and reduce and/or minimize the electrical usage in the sensor. If the air motion is negligible, then the heating element (171) may heat the local air in the tube (173). The heating is detected by averaging the response of the two thermistors (170, 172), and when a specific temperature is achieved, the electronics servo (174) may reduce the current to the heating element (171) to a level that only maintains the temperature. When air flows through the tube (173), substantial cooling of the average temperature of the two thermistors (170, 172) may occur, and the electronics servo (174) may increase the current to the heating element (171) to add additional heat to the flowing air. If these conditions occur and result in very high air flow rate, enough heat may be added to the air so that a temperature difference may be detectable.

Figure 16B:
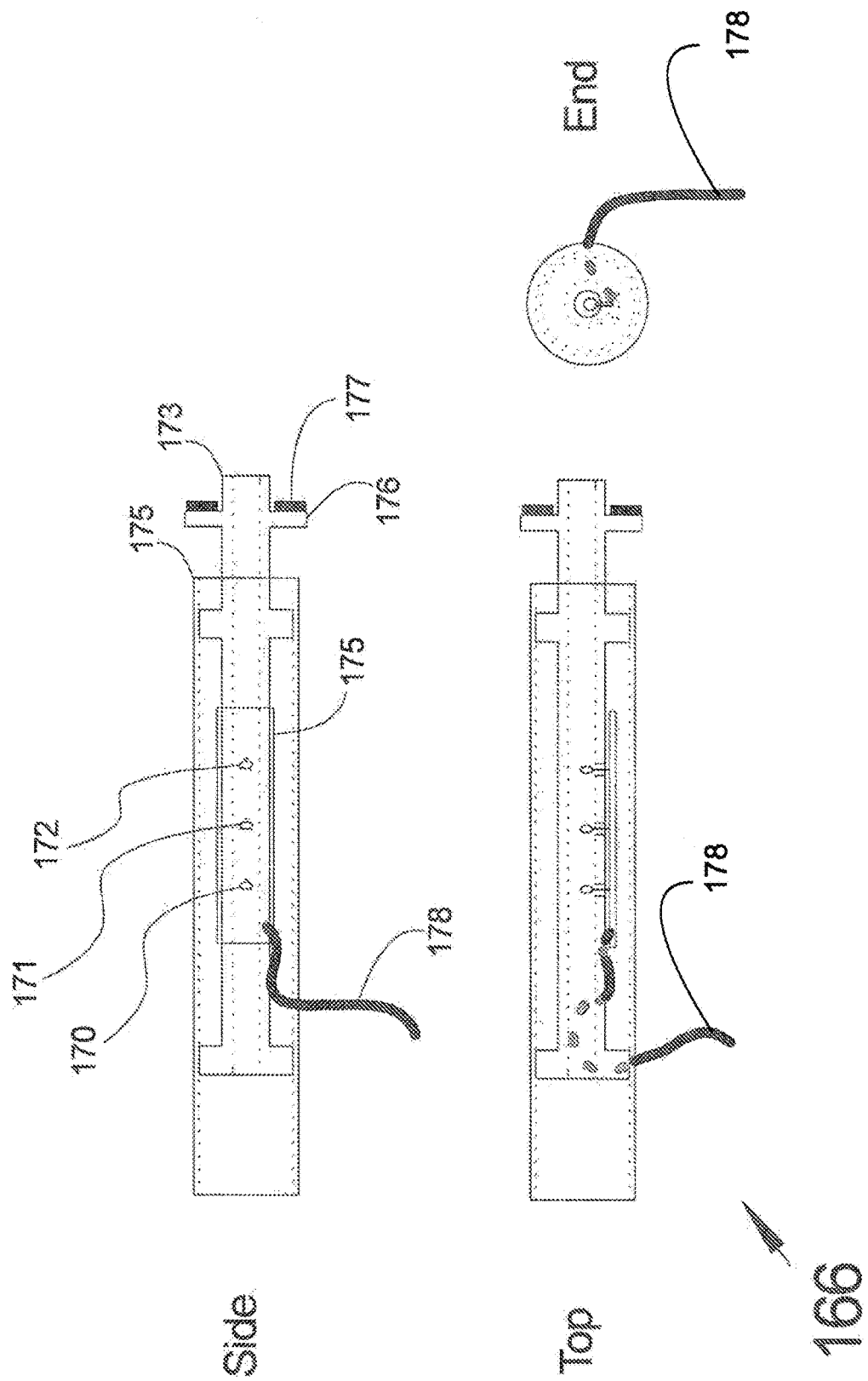
FIG. 16B shows another view of an air flow sensor.

FIG. 16b represents a possible instantiation of the air flow sensor (166). Three views presented are side, top and end and the principal components are the thermistors (170, 172), the heating element (171), and the tube (173) as previously described. In addition, an outer protective mounting tube (175) is shown which houses the air flow tube (173) and the thermistors (170, 172) and heating element (171). The outer tube allows electrical and mechanical isolation of the inner components from the mounting surface. Also shown is the electrical component mounting board (175) and the electrical connection lead (178) that may connect to the servo electronics. The tube (173) is shown with a shoulder flange (176) that backs up a gasket (177) that may mate with the opening in the door assembly.

Figure 16C:
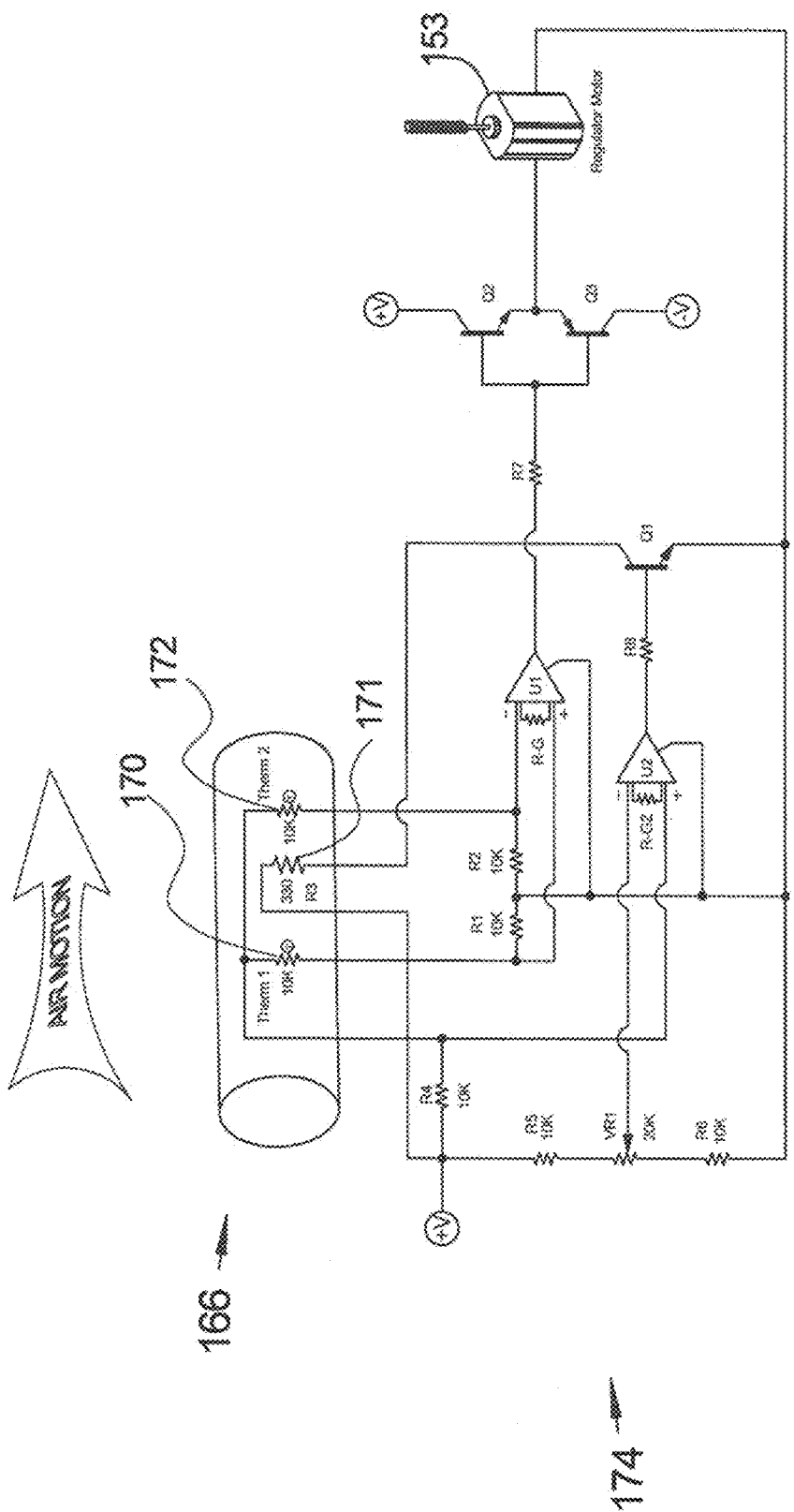
FIG. 16C shows an example of an electronic schematic diagram for the air flow sensor.

FIG. 16c is a schematic representation of one possible instantiation of the servo control electronics (174) with the air flow sensor (166) and the gate control motor (153) components described previously. Numerous electronic designs are possible for the servo electronics, and this is only one example of a possible configuration.

Thermistor 1 (170), thermistor 2 (172), R1 and R2 form a traditional Wheatstone Bridge, a configuration used in common practice. The Wheatstone bridge allows easy differentiation of the resistance of each of the thermistors. U1 is an instrumentation amplifier that essentially acts like an op-amp with programmable gain using R-G. With the instrumentation amplifier, the output offset from the input is disregarded and the gain control offered by the R-G resistor is uniform regardless of the common mode voltage of the two inputs. It is also a voltage gain amplifier, thus very low current is associated with biasing the input sense resistors and thermistors of the Wheatstone bridge.

If little to no air is moving, the temperature of both of the thermistors (170, 172) may be the same and the resistance of these may be similar or approximately the same. Thus the voltage at the inputs, + and −, may be the same and U1 may not output any voltage. Q2 and Q3, a NPN/PNP push-pull amplifier may have no drive to the bases and may remain off, thus not sending power to the regulator motor (153). When air is in motion the direction shown, thermistor 1 (170) cools slightly and it's resistance goes up. Heat from heating element R3 (171) is carried towards thermistor 2 (172) keeping it warmer than Thermistor 1 (170), so it maintains its resistance. The unbalanced resistance is divided across R1 and R2 to result in a lower voltage at the + input of the instrumentation amp U1, than the − input. Thus the output of u1 goes lower than the common voltage, which turns on Q3, thus supplying − Voltage to the input of the regulator motor (153). The motor turns a little bit, allowing less air to enter the cavity feeding the sensor (166), thus causing the air movement to slow or cease going through the sensor.

Airflow in the opposite direction may cause a reverse effect in the Wheatstone bridge, resulting in the + input to U1 to be positive with respect to the − input. This may result in the output of the U1 to go higher than the common voltage, turning on Q2, thus sending positive voltage to the Regulator motor (153) and turning it the opposite direction. This may allow more air into the cavity and slow or cease the airflow across the sensor (166).

It can be observed that as the air flow rate increases, the thermistor upstream may cool more quickly than the thermistor downstream. The result is a higher degree of amplification and thus a faster response on the motor. This relationship is often referred to as proportional control and is desirable to improve operation of the servo.

Note that the Wheatstone bridge formed by Thermistors 1 and 2, and resistors R1 and 2 acquire the voltage source at the top of the bridge via R4. Thus, all of the current going through the Wheatstone bridge is passing through R4. This means that the parallel sum of the resistances of the thermistors may bias R4. If either or both of the thermistors have value changes, the current may be biased, and thus the voltage at R4. This changing voltage appears at the + input of the second instrumentation amplifier U2, and is compared with a preset, but adjustable voltage at the input to the instrumentation amplifier U2− input. This input is the reference value determined from divider R5, Variable resistor 1, and R6. As the parallel sum of the resistance of thermistors 1 and 2 (170, 172) goes up in response to the average temperature of the thermistors, the voltage at the + input to U2 goes up also. The result is the output of U2 going up and turning on the transistor Q1, which in turn applies more current to R3 the heating element resistor. The space heats up in response to the sensed lowering temperature. The converse is true and the circuit acts as a temperature controller, which has it's set point based on the position of the variable resistor VR1.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed:
1. A data center system, comprising:
 a modular air-based cooling assembly formed from interconnecting air conduits;
 one or more cooling units for receiving air via the modular air-based cooling assembly;
 a first base module, comprising:
  a first equipment support unit with a first housing configured to mount a first set of electronic equipment inside the first housing; and
  a first cooling unit of the one or more cooling units matched to the first equipment support unit for interfacing the first equipment support unit with the modular air-based cooling assembly;
 a second base module, comprising:
  a second equipment support unit with a second housing configured to mount a second set of electronic equipment inside the second housing; and
  a second cooling unit of the one or more cooling units matched to the second equipment support unit for interfacing the second equipment support unit with the modular air-based cooling assembly;
 wherein:
  the modular air-based cooling assembly delivers cool air to the first and second equipment support units;
  the first base module is positioned adjacent and connected to the second base module;

the first cooling unit of the first base module is directly adjacent to the second cooling unit of the second base module;

the first cooling unit is a complementary shape to the second cooling unit so that the first and second cooling units align with one another;

the interconnecting air conduits further comprise:

a primary air conduit for receiving air from one or more air compressors; and a branch air conduit for receiving air from the primary air conduit and for directing air toward the first base module and the second base module.

2. The data center system as set forth in claim 1, wherein the first equipment support unit includes a number of spaces for supporting a corresponding number of electronic equipment of the first set of electronic equipment.

3. The data center system as set forth in claim 2, wherein the first cooling unit comprises a first number of plenums for supplying cooling air to the first set of electronic equipment, wherein the first number of plenums is the same as the number of spaces of the first equipment support unit.

4. The data center system as set forth in claim 3, wherein each of the plenums is connected to a pressurized air passageway via a valve.

5. The data center system as set forth in claim 4, wherein the valve is operative to control airflow as needed by an associated piece of electronic equipment.

6. The data center system as set forth in claim 4, wherein the pressurized air passageway is connected to the modular air-based cooling assembly.

7. The data center system as set forth in claim 4, wherein each of the plenums is generally wedge-shaped.

8. The data center system as set forth in claim 1, wherein the first base module and the second base module are configured to be interconnected by at least one of vertical stacking, back-to-back connections, or side-by-side connections.

9. A method for use in configuring a data center, comprising:

providing a number of base modules where each base module includes:

an equipment support unit with a housing configured to mount electronic equipment inside the housing; and a cooling unit including a number of plenums for supplying cool air to the electronic equipment, wherein the number of plenums receives the cool air via interconnecting air conduits; and interconnecting the number of base modules to form a data center of a desired configuration, wherein: the number of plenums and the number of electronic equipment is the same; a first base module of the number of base modules includes a first cooling unit; a second base module of the number of base modules includes a second cooling unit;

the first and second base modules of the number of base modules are adjacent to each other;

the first cooling unit of the first base module of the number of base modules is directly adjacent to the second cooling unit of the second base module of the number of base modules;

the first cooling unit is a complementary shape to the second cooling unit so that the first and second cooling units align with one another;

the interconnecting air conduits further comprise:

a primary air conduit for receiving air from one or more air compressors; and a branch air conduit for receiving air from the primary air conduit and for directing air toward the first base module and the second base module.

10. The method as set forth in claim 9, wherein the step of interconnecting comprises interconnecting the first and second base modules by at least one of vertical stacking, back-to-back connections, or side-by-side connections.

11. The method as set forth in claim 10, wherein each of the first and second cooling units comprise plenums connected to a pressurized air passageway via a valve, and the step of interconnecting comprises vertically stacking the first and second base modules such that pressurized air passageways of the first and second base modules are interconnected.

* * * * *